(12) United States Patent
Suh et al.

(10) Patent No.: US 7,795,663 B2
(45) Date of Patent: Sep. 14, 2010

(54) ACCEPTOR DOPED BARIUM TITANATE BASED THIN FILM CAPACITORS ON METAL FOILS AND METHODS OF MAKING THEREOF

(75) Inventors: Seigi Suh, Cary, NC (US); William J. Borland, Cary, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/157,894

(22) Filed: Jun. 21, 2005

(65) Prior Publication Data

US 2006/0284233 A1 Dec. 21, 2006

(51) Int. Cl.
*H01L 27/108* (2006.01)
*H01L 29/94* (2006.01)

(52) U.S. Cl. .............. 257/310; 257/E29.015; 257/E21.009; 438/240; 438/785

(58) Field of Classification Search ........... 438/238, 438/239, 240, 785, FOR. 395, FOR. 400, 438/FOR. 430; 257/310, E29.015, E21.009; 361/313–315, 322
See application file for complete search history.

(56) References Cited

U.S. PATENT DOCUMENTS

| | | | | |
|---|---|---|---|---|
| 2,990,498 A * | 6/1961 | Evans | | 361/763 |
| 3,747,045 A * | 7/1973 | Stross | | 439/55 |
| 5,130,281 A * | 7/1992 | Sano et al. | | 501/138 |
| 5,198,269 A | 3/1993 | Swartz et al. | | |
| 5,271,955 A | 12/1993 | Maniar | | |
| 5,342,648 A | 8/1994 | MacKenzie et al. | | |
| 5,384,294 A | 1/1995 | Teowee et al. | | |
| 5,391,393 A | 2/1995 | Maniar | | |
| 5,453,908 A * | 9/1995 | Tsu et al. | | 361/321.5 |
| 5,456,908 A * | 10/1995 | Aziz et al. | | 424/78.08 |
| 5,563,762 A * | 10/1996 | Leung et al. | | 361/301.4 |
| 5,635,741 A * | 6/1997 | Tsu et al. | | 257/310 |
| 5,853,500 A * | 12/1998 | Joshi et al. | | 148/247 |
| 5,962,654 A | 10/1999 | Duncombe et al. | | |
| 6,074,803 A * | 6/2000 | McGrath et al. | | 430/311 |
| 6,078,494 A * | 6/2000 | Hansen | | 361/321.5 |

(Continued)

FOREIGN PATENT DOCUMENTS

EP 0476143 B1 1/1995

(Continued)

OTHER PUBLICATIONS

U.S. Appl. No. 10/621,796, filed Jan. 20, 2005, Borland et al.

(Continued)

*Primary Examiner*—Matthew S Smith
*Assistant Examiner*—Quovaunda Jefferson

(57) ABSTRACT

The present invention is directed to a dielectric thin film composition comprising: (1) one or more barium/titanium-containing additives selected from (a) barium titanate, (b) any composition that can form barium titanate during firing, and (c) mixtures thereof; dissolved in (2) organic medium; and wherein said thin film composition is doped with 0.002-0.05 atom percent of a dopant comprising an element selected from Sc, Cr, Fe, Co, Ni, Ca, Zn, Al, Ga, Y, Nd, Sm, Eu, Gd, Dy, Ho, Er, Yb, Lu and mixtures thereof and to capacitors comprising such compositions.

7 Claims, 23 Drawing Sheets

U.S. PATENT DOCUMENTS

| | | | |
|---|---|---|---|
| 6,160,472 A * | 12/2000 | Arashi et al. | 338/21 |
| 6,337,032 B1 | 1/2002 | Chivukula et al. | |
| 6,477,034 B1 | 11/2002 | Chakravorty et al. | |
| 6,541,137 B1 | 4/2003 | Borland et al. | |
| 6,631,551 B1 * | 10/2003 | Bowles et al. | 29/620 |
| 7,572,518 B2 * | 8/2009 | Borland et al. | 428/469 |
| 7,601,181 B2 * | 10/2009 | Borland et al. | 29/25.03 |
| 2001/0035562 A1 * | 11/2001 | Kimura et al. | 257/532 |
| 2002/0145168 A1 * | 10/2002 | Bojarczuk et al. | 257/388 |
| 2002/0195612 A1 | 12/2002 | Farrell | |
| 2003/0128496 A1 * | 7/2003 | Allen et al. | 361/306.3 |
| 2004/0138050 A1 | 7/2004 | Wang | |
| 2006/0287188 A1 * | 12/2006 | Borland et al. | 501/137 |

FOREIGN PATENT DOCUMENTS

| | | |
|---|---|---|
| EP | 0704550 A2 | 4/1996 |
| EP | 0709355 A1 | 5/1996 |
| WO | WO 01/67465 A2 | 9/2001 |

OTHER PUBLICATIONS

X. Li and W. H. Shih, Size Effects in Barium Titanate Particles and Clusters, J. Am. Comm. Soc. 80 (11) 1997, pp. 2844-2852.

M. N. Kamalasanan, N. D. Kumar, and S. Chandra, Structural, optical, and dielectric properties of sol-gel derived SrTiO3 thin films, J. Appl. Phys. 74 (1), Jul. 1993, pp. 679-686.

E. Dien, J. B. Briot, M. Lejeune and A. Smith, Relationship Between Processing and Electrical Behavior of BST Films Deposited by Spin Coating, Journal of the European Ceramic Society, vol. 19, (1999), pp. 1349-1352.

M. Losurdo, P. Capezzuto, G. Bruno, G. Perna and V. Capozzi, N2-H2 remote plasma nitridation for GaAs surface passivaton, Applied Physics Letters, vol. 81, No. 1, Jul. 1, 2002, pp. 16-18.

M.N. Kamalasanan, N. Deepak Kumar and Subhas Chandra, Structural and microstructural evolution of barium titanate thin films deposited by the sol-gel process, J. Appl. Phys. 76 (8), Oct. 15, 1994, pp. 4603-4609.

N. Deepak Kumar, M.N. Kamalasanan and Subhas Chandra, Metalorganic chemical vapor deposition technique for growing c-axis oriented ZnO thin films in atmospheric pressure air, Appl. Phys. Lett. 65 (11), Sep. 12, 1994, pp. 1373-1375.

J. T. Dawley and P. G. Clem, Dielectric properties of random and <100> oriented SrTiO3 and (Ba,Sr)TIO3 thin films fabricated on <100> nickel tapes, Applied Physics Letters, vol. 81, No. 16, Oct. 14, 2002, pp. 3028-3030.

G. Arlt, D. Hennings and G. De With, Dielectric properties of fine-grained barium titanate ceramics, J. Appl. Phys. 58 (4), Aug. 15, 1985, pp. 1619-1625.

Angus I. Kingon, Taeyun Kim, Jon-Paul Maria, and Robert Croswell, Integration of Thin Film Capacitors into Polymer-Based Wiring Boards or MCM-Ls, NC State University, Department of Materials Science and Engineering. Jun. 13, 2002.

Angus I. Kingon, Taeyun Kim, Paula Vilarinho, Jon-Paul Maria, and Robert Croswell, Thin Film Capacitors Embedded into High Density Printed Circuit Boards, NC State University, Department of Materials Science and Engineering, Oct. 10, 2001.

Q. Zou, H. E. Ruda and B. G. Yacobi, Dielectric properties of lead zirconate titanate thin films deposited on metal foils, Applied Physics Letters, vol. 77, No. 7, Aug. 14, 2000, pp. 1038-1040.

Q. Zou, H. E. Ruda and B. G. Yacobi, Improved dielectric properties of lead zirconate titanate thin films deposited on metal foils with LaNiO3 buffer layers, Applied Physics Letters, vol. 78, No. 9, Feb. 26, 2001, pp. 1282-1284.

Butrand Lee, Jianping Zhang, Preparation, structure evolution and dielectric properties of BaTiO3 thin films and powders by an aqueous sol-gel process, Thin Solid Films, 388 (2001), pp. 107-113.

M. H. Frey and D. A. Payne, Nanocrystalline barium titanate: Evidence for the absence of ferroelectricity in sol-gel derived thin-layer capacitors, Appl. Phys. Lett 63 (20), Nov. 15, 1993, pp. 2753-2755.

M. H. Frey and D. A. Payne, Grain-size effect on structure and phase transformations for barium titanate, Physical Review B, vol. 54, No. 5, Aug. 1, 1996-1, pp. 3158-3168.

R. W. Schwartz, P. G. Clem, J. A. Voigt, E. R. Byhoff, M. Van Stry, T. J. Headley and N.A. Missert, Control of Microstructure and Orientation in Solution-Deposited BaTiO3 and SrTiO3 Thin Films, J. Am. Ceram. Soc., vol. 82, No. 9, (1999), pp. 2359-2367.

Danielle M. Tahan, Ahmad Safari and Lisa C. Klein, Preparation and Characterization of BaxSr1-xTiO3 Thin Films by a Sol-Gel Technique, J. Am. Ceram. Soc., vol. 79, No. 6, (1996), pp. 1593-1598.

Jon-Paul Maria, Kevin Cheek, Stephen Streiffer, Seung-Hyun Kim, Greg Dunn and Angus Kingon, Lead Zirconate Titanate Thin Films on Base-Metal Foils; An Approach for Embedded High-Permittivity Passive Components, J. Am. Ceram. Soc. 84 (10), 2001, pp. 2436-2438.

W. J. Lee and H. G. Kim, Microstructure dependence of electrical properties of (Ba0.5Sr0.5)TiO3 thin films deposited on Pt/SiO2/Si, J. Appl. Phys. 80 (10), Nov. 15, 1996, pp. 5891-5894.

M. N. Kamalasaan, N. D. Kumar and S. Chandra, Dielectric and ferroelectric properties of BaTiO3 thin films grown by the sol-gel process, J. Appl. Phys. 74 (9), Nov. 1, 1983, pp. 5679-5686.

D. M. Smyth, Barium Titanate, The Defect Chemistry of Metal Oxides, Oxford University Press, 2000, pp. 252-282.

European Search Report in Corresponding EP Application No. 06012013.

* cited by examiner

ACCEPTOR DOPED BARIUM TITANATE BASED THIN FILM CAPACITORS ON METAL FOILS AND METHODS OF MAKING THEREOF

TECHNICAL FIELD

The present invention pertains to thin film capacitors, more particularly to thin film capacitors formed on copper foil that can be embedded in printed wiring boards (PWB) to provide capacitance for decoupling and controlling voltage for integrated circuit die that are mounted on the printed wiring board package.

RELATED ART

As semiconductor devices including integrated circuits (IC) operate at higher frequencies, higher data rates and lower voltages, noise in the power and ground (return) lines and supplying sufficient current to accommodate faster circuit switching becomes an increasingly important problem requiring low impedance in the power distribution system. In order to provide low noise, stable power to the IC, impedance in conventional circuits is reduced by the use of additional surface mount technology (SMT) capacitors interconnected in parallel. The higher operating frequencies (higher IC switching speeds) mean that voltage response times to the IC must be faster. Lower operating voltages require that allowable voltage variations (ripple) and noise become smaller. For example, as a microprocessor IC switches and begins an operation, it calls for power to support the switching circuits. If the response time of the voltage supply is too slow, the microprocessor will experience a voltage drop or power droop that will exceed the allowable ripple voltage and noise margin and the IC will trigger false gates. Additionally, as the IC powers up, a slow response time will result in power overshoot. Power droop and overshoot must be controlled within allowable limits by the use of capacitors that are close enough to the IC that they provide or absorb power within the appropriate response time. This power droop and overshoot are maintained within the allowable limits by the use of capacitors providing or absorbing power in the appropriate response time.

Capacitors for decoupling and dampening power droop or overshoot are generally placed as close to the IC as possible to improve their performance. Conventional designs have capacitors surface mounted on the printed wiring board (PWB) clustered around the IC. In this case, large numbers of capacitors requires complex electrical routing which leads to inductance. As frequencies increase and operating voltages continue to drop, power increases and higher capacitance has to be supplied at increasingly lower inductance levels. A solution would be to incorporate a high capacitance density, thin film ceramic capacitor in the PWB package onto which the IC is mounted. A single layer ceramic capacitor directly under the IC reduces the inductance to as minimum as possible and the high capacitance density provides the capacitance to satisfy the IC requirements. Such a capacitor in the PWB can provide capacitance at a significantly quicker response time and lower inductance.

Embedding ceramic capacitor films in printed wiring boards is known. Capacitors are initially formed on metal foils by depositing a capacitor dielectric material on the foil and annealing it at an elevated temperature. A top electrode is formed on the dielectric to form a fired capacitor on foil structure. The foil is then bonded to an organic laminate structure to create an inner layer panel wherein the capacitor is embedded in the panel. These inner layer panels are then stacked and connected by interconnection circuitry, the stack of panels forming a multi-layer printed wiring board.

A high capacitance density capacitor can be achieved by use of a dielectric with a high permittivity or dielectric constant (K) and a thin dielectric. High dielectric constants are well known in ferroelectric ceramics. Ferroelectric materials with high dielectric constants include perovskites of the general formula $ABO_3$ in which the A site and B site can be occupied by one or more different metals. For example, high K is realized in crystalline barium titanate (BT), lead zirconate titanate (PZT), lead lanthanum zirconate titanate (PLZT), lead magnesium niobate (PMN) and barium strontium titanate (BST) and these materials are commonly used in surface mount component devices. Barium titanate based compositions are particularly useful as they have high dielectric constants and they are lead free.

Thin film capacitor dielectrics with a thickness of less than 1 micron are well known. Thin films can be deposited on to a substrate by sputtering, laser ablation, chemical vapor deposition, and chemical solution deposition. Initial deposition is either amorphous or crystalline depending upon deposition conditions. Amorphous compositions have low K (approximately 20) and have to be annealed at high temperatures to induce crystallization and produce the desired high K phase. The high K phase in barium titanate based dielectrics can only be achieved when grain sizes exceed 0.1 micron and so annealing temperatures as high as 900° C. may be used.

Chemical solution deposition (CSD) techniques are commonly used to form thin film capacitors on metal foils. CSD techniques are desirable due to their simplicity and low cost. High temperature annealing of barium titanate thin CSD films formed on base metal foils such as copper or nickel, require low oxygen partial pressures to avoid oxidation of the metal. The low oxygen partial pressures, however, often result in high leakage currents under applied bias (current densities) in barium titanate based compositions due to reduction of the dielectric material. In worse case situations, the capacitor may be shorted and dielectric properties cannot be measured. This may be addressed by a subsequent re-oxidation procedure carried out at lower temperatures in which the dielectric and metal foil is exposed to higher partial pressures of oxygen but this results in oxidation of the base metal foil.

A barium titanate CSD composition is disclosed in U.S. National patent application Ser. No. 10/621,796 (U.S. Patent Publication No. 2005-001185), herein incorporated by reference. The composition is particularly suitable for forming high capacitance density, ceramic films on copper foil. The precursor composition comprises the following chemicals:

| | |
|---|---|
| Barium acetate | 2.6 g |
| Titanium isopropoxide | 2.9 ml |
| Acetylacetone | 2.0 ml |
| Acetic acid | 10.0 ml |
| Methanol | 15 ml |

After annealing at 900° C. in a partial pressure of oxygen of approximately $10^{-11}$ atmospheres, a platinum electrode was sputtered on to the dielectric. However, while capacitance of the film could be measured, the dissipation factor was very high under bias and the film was semi-conducting and exhibited a very high leakage current density under bias. Under such reducing conditions of the annealing process, the barium titanate dielectric was reduced according to the following equation:

$$BaTiO_3 + xH_2 \rightarrow BaTiO_{3-x} + xH_2O$$

A re-oxidation procedure was therefore, necessary to produce parts that had good electrical data. This procedure can oxidize the foil and does not necessarily produce optimum capacitor performance, particularly with respect to leakage current density under bias. It is also not cost effective to re-oxidize the dielectric in a separate step. It would be an advantage, therefore, if the barium titanate composition could be doped to produce good electrical performance, particularly a low leakage current density under bias, immediately after the low oxygen partial pressure annealing process.

SUMMARY

The present invention is directed to a dielectric thin film composition comprising: (1) one or more barium/titanium-containing additives selected from (a) barium titanate, (b) any composition that can form barium titanate during firing, and (c) mixtures thereof; dissolved in (2) organic medium; and wherein said thin film composition is doped with 0.002-0.05 atom percent of a dopant comprising an element selected from Sc, Cr, Fe, Co, Ni, Ca, Zn, Al, Ga, Y, Nd, Sm, Eu, Gd, Dy, Ho, Er, Yb, Lu and mixtures thereof.

The present invention is further directed to a method of making a capacitor comprising: providing a metallic foil; forming a dielectric over the metallic foil, wherein forming the dielectric comprises: forming a dielectric layer over the foil wherein the dielectric layer is formed from the composition detailed above; annealing the dielectric layer; and forming a conductive layer over the dielectric, wherein the metallic foil, the dielectric, and the conductive layer form the capacitor.

Those skilled in the art will appreciate the above stated advantages and other advantages and benefits of various additional embodiments of the invention upon reading the following detailed description of the embodiments with reference to the below-listed drawings.

According to common practice, the various features of the drawings discussed below are not necessarily drawn to scale. Dimensions of various features and elements in the drawings may be expanded or reduced to more clearly illustrate the embodiments of the invention.

BRIEF DESCRIPTION OF THE DRAWINGS

The detailed description will refer to the following drawings, wherein like numerals refer to like elements, and wherein.

DETAILED DESCRIPTION

Figure 1:
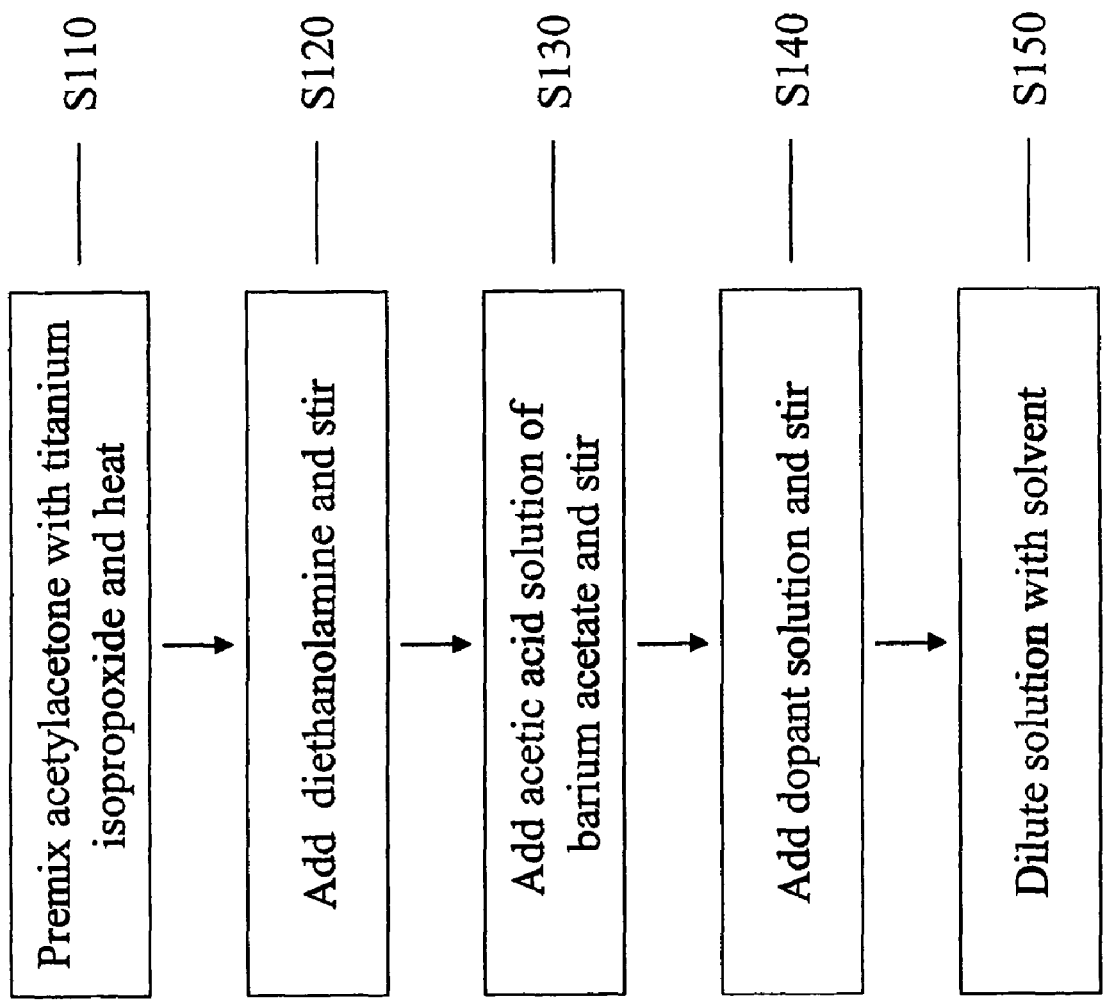
FIG. 1 is a block diagram illustrating a process for preparing a precursor solution used to form a dielectric that does not require a re-oxidation process.

High capacitance density thin film acceptor doped barium titanate based dielectrics with low dielectric losses and leakage currents and methods of making thereof are disclosed.

According to a first embodiment, high capacitance density, thin film CSD acceptor doped barium titanate based dielectric compositions are disclosed. The compositions eliminate the requirement of a re-oxidation procedure after annealing the dielectric layer at a temperature of approximately 900° C., under a low partial pressure of oxygen of approximately $10^{-11}$ atmospheres.

Capacitors constructed according to the above method can be embedded into inner-layer panels, which may in turn be incorporated into printed wiring boards. The capacitors have high capacitance densities, low loss tangents, and low leakage current densities under bias. Further, the methods according to the present invention may be practiced without the use of a re-oxidation treatment while using environmentally desirable materials.

The acceptor doped barium titanate based dielectrics according to the present invention may exhibit essentially a similar capacitance density and equal to or improved loss tangent to those dielectrics using undoped barium titanate after a re-oxidation procedure. The acceptor doped barium titanate based dielectrics when processed without a re-oxidation procedure, however, have much lower leakage current densities under bias than re-oxidized pure barium titanate.

Acceptor doping on the titanium site (B site) of crystalline barium titanates based dielectrics is used to form high permittivity dielectric films or layers in the capacitor embodiments discussed in this specification. Acceptor doping on the titanium site can be achieved by using elements that have a lower valence state than titanium but have ionic radii that is similar enough to titanium for them to dissolve on the titanium site under the right conditions. In particular, dopants such as Sc, Cr, Fe, Co, Ni, Mg, Ca, Zn, Al, Ga, Y and some lanthanide metals such as Nd, Sm, Eu, Gd, Dy, Ho, Er, Yb, Lu, and mixtures of these dopants and metals can occupy the B site of the ($ABO_3$) perovskite structure. Acceptor dopants trap conduction electrons so that a decrease in insulation resistance and increase in dielectric losses are suppressed. Acceptor doping with as little 0.002 atom percent may be used to create high dielectric constant thin film dielectrics that exhibit low dielectric losses and low leakage currents under bias to be fabricated under reducing conditions.

$BaTiO_3$ is a preferred core material in the formation of high capacitance density dielectrics according to the present invention. However, metal cations with the oxide stoichiometry of $MO_2$ may also be used to substantially substitute for titanium (e.g., Zr, Hf, Sn and mixtures thereof). While the terms "partially" and "substantially" are not meant to be particularly limiting, there are various preferred embodiments. In one embodiment, "partially" is defined as up to and including 10 molar percent of the titanium. In one embodiment, "substantially" is defined as up to and including 50 molar percent of the titanium. These broaden the temperature dependence of capacitance at the Curie point in the dielectric by "pinching" (shifting) the three phase transitions of $BaTiO_3$ closer to one another in temperature space. Metal cations having the oxide stoichiometry of MO (e.g., Pb, Ca, Sr and mixtures thereof) may also be used to substantially substitute for barium. While the terms "partially" and "substantially" are not meant to be particularly limiting, there are various preferred embodiments. In one embodiment, "partially" is defined herein as up to and including 10 molar percent of the barium. In one embodiment, "substantially" is defined as up to and including 50 molar percent of the barium. These cations shift the dielectric Curie point to higher or lower temperatures depending upon the material used.

The capacitor embodiments discussed herein have a physically robust dielectric thickness in the range of about 0.4-1.0 μm with a capacitance density of approximately between 1 and 1.8 $\mu F/cm^2$. Capacitors of this capacitance density range have a breakdown voltage in excess of about 20 volts.

Chemical solution deposition techniques may be used to form the dielectric. CSD techniques are desirable due to their simplicity and low cost. The chemical precursor solution from which acceptor doped $BaTiO_3$ based dielectrics are prepared preferably comprise barium acetate, titanium isopropoxide, acetylacetone, acetic acid, diethanolamine, and an acceptor dopant source. The precursor solution may or may not contain substantial sources of other substitutions for barium or titanium as previously discussed. Some examples of acceptor dopant precursors are given in Table I.

TABLE I

| Metal | Dopant chemicals and amount | Solvent(s) amount |
| --- | --- | --- |
| Ga | Gallium acetylacetatonate, 0.43 g | Acetic acid, 29.57 g |
| Al | Aluminum acetylacetonate, 0.38 g | Acetic acid, 29.62 g |
| Zn | Zinc acetate dihydrate, 0.31 g | Acetic acid, 28.16 g Distilled water, 2 g |
| Ca | Calcium acetate monohydrate, 0.22 g | Acetic acid, 27.78 g Distilled water, 2 g |
| Fe | α-Hydroxyethylferrocene, 0.26 g | Acetic acid, 29.74 g |
| Co | Cobalt (II) acetate tetrahydrate, 0.29 g | Acetic acid, 29.71 g |
| Ni | Nickel acetate tetrahydrate, 0.21 g | Acetic acid, 29.79 g |
| Mg | Magnesium acetate tetrahydrate, 0.25 g | Acetic acid, 29.75 g |
| Y | Yttrium acetate hydrate, 0.32 g | Acetic acid, 29.68 g |
| Yb | Ytterbium acetylacetonate hydrate, 0.55 g | Acetic acid, 29.45 g |

FIG. 1 is a block diagram illustrating a process for preparing a precursor solution that will be used to form a dielectric according to the present invention. In step S110, titanium isopropoxide is premixed with acetyl acetone and heated. The premix can be done in, for example, a PYREX® container, and heating may take place on a hot plate with a surface temperature of about 90° C. In step S120, diethanolamine is added to the Ti isopropoxide/acetylacetone mixture. In step S130, a solution of barium acetate in acetic acid is added into the container, and stirred. In step S140, a dopant solution chosen from those listed in Table I is added in an amount to give a dopant concentration of 0.017-0.018 atom percent and the mixed solution is stirred. In step S150, acetic acid is added to the solution to yield a 0.2-0.3 molar concentration. The precursor solution is now suitable for deposition.

Figure 2:
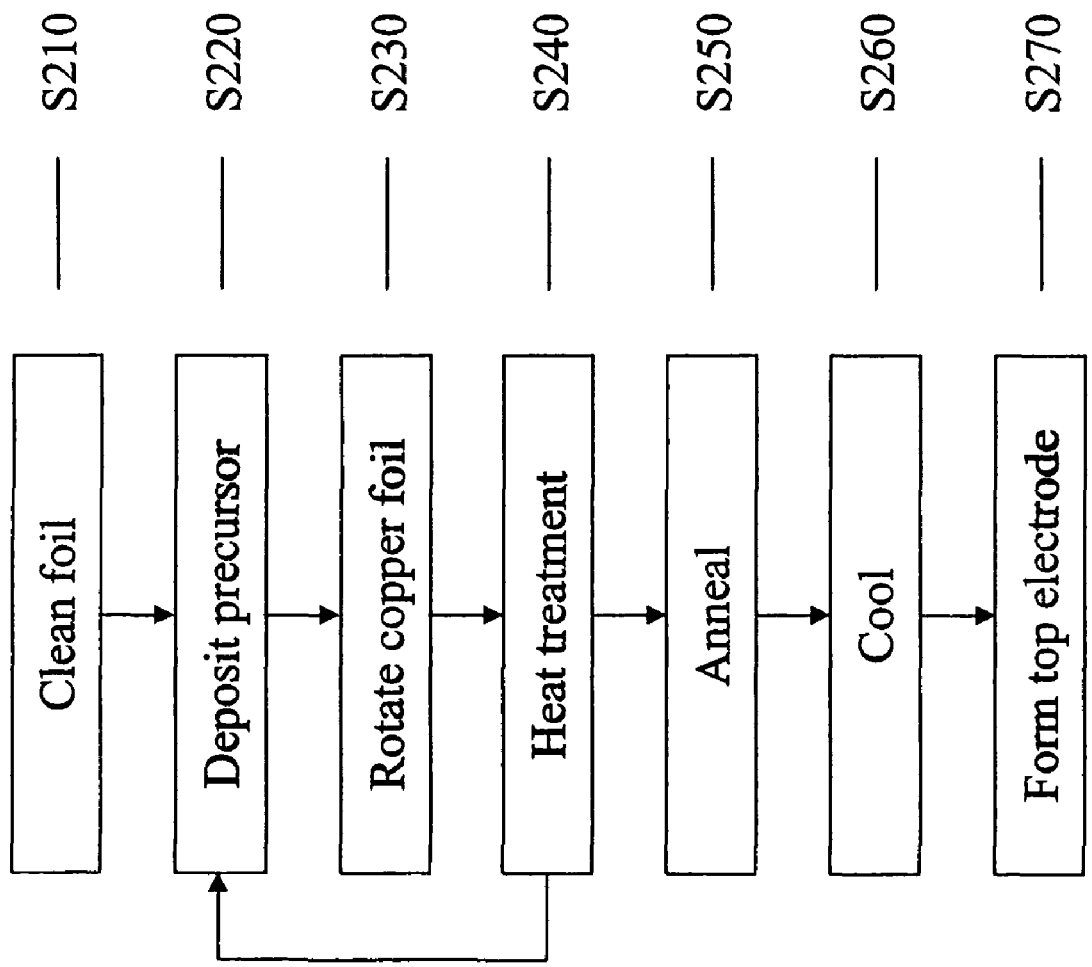
FIG. 2 is a block diagram illustrating a process for making a capacitor on copper foil.

FIG. 2 is a block diagram of a method suitable for forming a capacitor according to the present invention. The dielectric of the resultant capacitor may be formed using the precursor solution discussed above with reference to FIG. 1. Variants of the acetylacetone components and the acetic acid used for dilution in the above-described precursor solution may also be used. For example, acetic acid may be substituted with methanol. Acetylacetone may be substituted by an alkoxyalcohol such as 2-methoxyethanol, 2-ethoxyethanol and 1-methoxy-2-propanol, or ethanolamines such as triethanolamine, diethanolamine and monoethanolamine. Acetic acid may also be substituted by methanol, ethanol, isopropanol, butanol and other alcohols, for example. Titanium isopropoxide may also be substituted by titanium butoxide.

The deposition process illustrated in FIG. 2 is spin coating. Other coating methods, such as dip or spray coating, are also feasible. In step S210, a metallic foil may be cleaned. Cleaning is not always necessary but may be advisable. The metallic foil may be made from copper or other suitable metal. Copper foils are desirable due their low cost and ease of handling. The copper foil will serve as a substrate on which a capacitor is built. The copper foil also acts as a capacitor "bottom" electrode in the finished capacitor. In one embodiment, the substrate is an 18 μm thick electroless, bare copper foil. Other untreated foils, such as 1 oz copper foil, are also suitable. Suitable cleaning conditions include etching the foil for 30 seconds in a dilute solution of copper chloride in hydrochloric acid. The etching solution may be diluted approximately 10,000 times from its concentrated form. The cleaning process removes the excess oxide layer, fingerprints and other accumulated foreign matter from the foil. If the copper foil is received from a vendor or other source in a substantially clean condition, and is handled carefully and promptly used, the recommended cleaning process may not be necessary.

The copper foil is preferably not treated with organic additives. Organic additives are sometimes applied in order to enhance adhesion of a metallic substrate to epoxy resins. Organic additives, however, may degrade the dielectric film during annealing.

In step S220, the precursor solution discussed above with reference to FIG. 1 is deposited over the drum side (or "smooth side") of the copper foil substrate. The precursor solution may be applied using, for example, a plastic syringe.

In step S230, the substrate is rotated for spin coating. A suitable rotation time and speed are 30 seconds at 3000 revolutions per minute. In step S240, the substrate is heat-treated. Heat treatment may be performed, for example, at a temperature of 250° C. for five to ten minutes. Heat treatment is used to dry the precursor solution by evaporating solvents in the precursor solution. Consecutive spinning steps may be used to coat the foil substrate to the desired thickness. Six spinning steps, for example, may be used to produce a final dried dielectric precursor thickness over 0.5 μm.

In step S250, the coated substrate is annealed. Annealing first removes residual organic material, and then sinters, densifies and crystallizes the dried dielectric precursor. Annealing may be conducted in a high temperature, low oxygen partial pressure environment. A suitable total pressure environment is about 1 atmosphere. A suitable oxygen partial pressure is about $10^{-10}$ to $10^{-11}$ atmospheres.

In step S250, the low oxygen partial pressure may be achieved by bubbling high purity nitrogen through a controlled temperature water bath. Other gas combinations are also possible. In one embodiment, the furnace temperature is at least about 900° C., and the oxygen partial pressure is approximately $10^{-11}$ atmospheres. The water bath may be at a temperature of about 25° C. The annealing can be performed by inserting the coated foil substrate into a furnace at temperatures below 250° C. The furnace is then ramped up to 900° C. at a rate of about 30° C./minute. The furnace is maintained at 900° C. for approximately 30 minutes.

In step S260, the foil substrate is allowed to cool. Cooling may be governed by a Newtonian profile, for example, created by simply switching the furnace off. Alternatively, the furnace temperature may be ramped down at a specific rate. When the furnace temperature reaches about 450° C., the foil substrate may be safely removed from the furnace without risk of undesired oxidation effects on the copper foil. Alternatively, the furnace may be allowed to return to room temperature before the foil substrate is removed from the furnace.

In the low oxygen partial pressure annealing process, the copper foil is not oxidized to $Cu_2O$ or $CuO$. This resistance to oxidation is due to the low oxygen pressure and high processing temperature. The dielectric is also not reduced and maintains its good electrical characteristics, particularly a low leakage current density under bias. This resistance to reduction is due to the acceptor doping. With acceptor doping, conduction electrons are trapped by the acceptor dopant so that a decrease in insulation resistance and increase in dielectric losses are suppressed.

The high temperature annealing of 900° C. described above for densification and crystallization of the deposited dielectric provides desirable physical properties and desirable electrical properties. One desirable physical property is a dense microstructure. Another desirable physical property is resultant grain sizes between 0.5 μm and 0.2 μm. One desirable electrical property resulting from the grain size is a capacitance density in excess of 1 μF/cm². An additional desirable property is a low loss tangent, which in one embodiment may be less than 5 percent. In another embodiment, the loss tangent may be less than 2.5 percent.

In step 270, top electrodes are formed over the resulting dielectric. The top electrode can be formed by, for example, sputtering, evaporation, chemical vapor deposition, electroless plating, printing or other suitable deposition methods. In one embodiment, sputtered platinum electrodes are used. Other suitable materials for the top electrode include nickel, copper, gold and palladium. The top electrodes may be plated with copper to increase thickness, if desired.

The following example illustrates the favorable properties in dielectrics prepared according to the present invention, and the capacitors incorporating the dielectrics.

EXAMPLE 1

An undoped pure barium titanate thin film was prepared on a copper foil using the formula listed below and prepared as outlined in FIG. 1. The copper foil was coated with the dielectric precursor composition using the method outlined in FIG. 2.

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |

Figure 3:
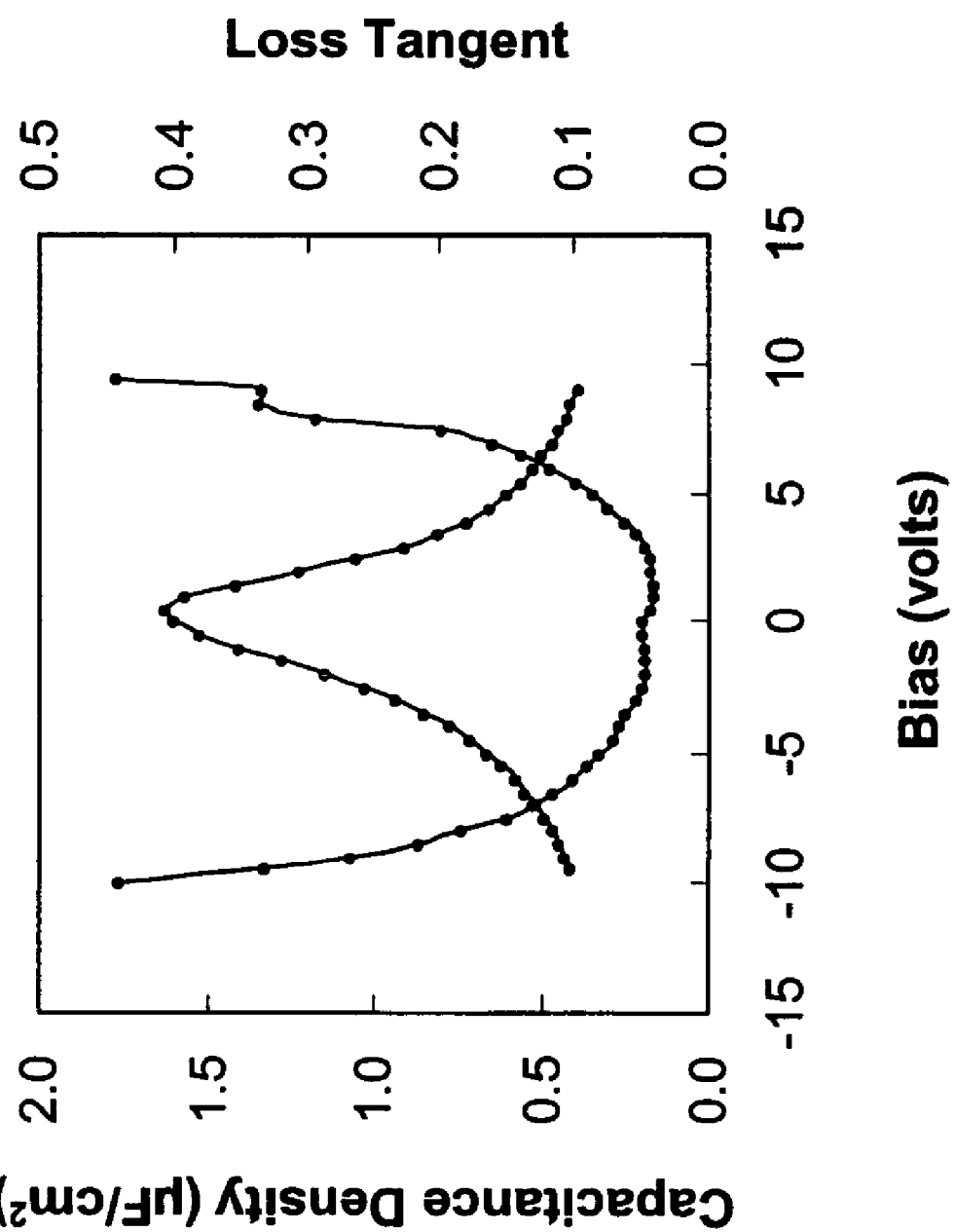
FIG. 3 is a graph showing capacitance density and loss tangent as a function of voltage for undoped barium titanate without re-oxidation.

The formula was then spin-coated on Cu foil. After each coat the film were pre-baked at temperatures at 250° C. on a hot plate in air. The coating/pre-baking process was repeated six times. The coated copper foil was annealed at 900° C. for 30 minutes under a partial pressure of oxygen of approximately $10^{-11}$ atmospheres. After annealing the pure barium titanate, a platinum top electrode was sputtered on to the dielectric and the capacitance, dissipation factor and leakage current density under bias was measured. The capacitance density was approximately 1.5 μF/cm² at 0 volt but the loss tangent increased dramatically in the voltage sweep as shown in FIG. 3.

EXAMPLE 2

An undoped pure barium titanate thin film was prepared on a copper foil using the formula listed below and prepared as outlined in FIG. 1. The copper foil was coated with the dielectric precursor composition using the method outlined in FIG. 2.

| | |
|---|---|
| Barium acetate | 2.0 g |
| Titanium isopropoxide | 2.22 g |

-continued

| | |
|---|---|
| Acetylacetone | 1.56 g |
| Acetic acid | 17.0 g |
| Diethanolamine | 0.21 g |

The formula was then spin-coated on Cu foil. After each coat the film were pre-baked at temperatures at 250° C. on a hot plate in air. The coating/pre-baking process was repeated six times. The coated copper foil was annealed at 900° C. for 30 minutes under a partial pressure of oxygen of approximately $10^{-11}$ atmospheres. The dielectric was then re-oxidized by placing the foil in a vacuum chamber under an atmosphere of approximately $10^{-5}$ Torr of oxygen at 550° C. for 30 minutes. This condition was chosen to avoid significant oxidation of the copper foil while still providing oxygen for re-oxidation of the dielectric. After re-oxidation, a top platinum electrode was sputtered on to the dielectric and the capacitance, dissipation factor and leakage current density under bias could be measured.

Figure 4:
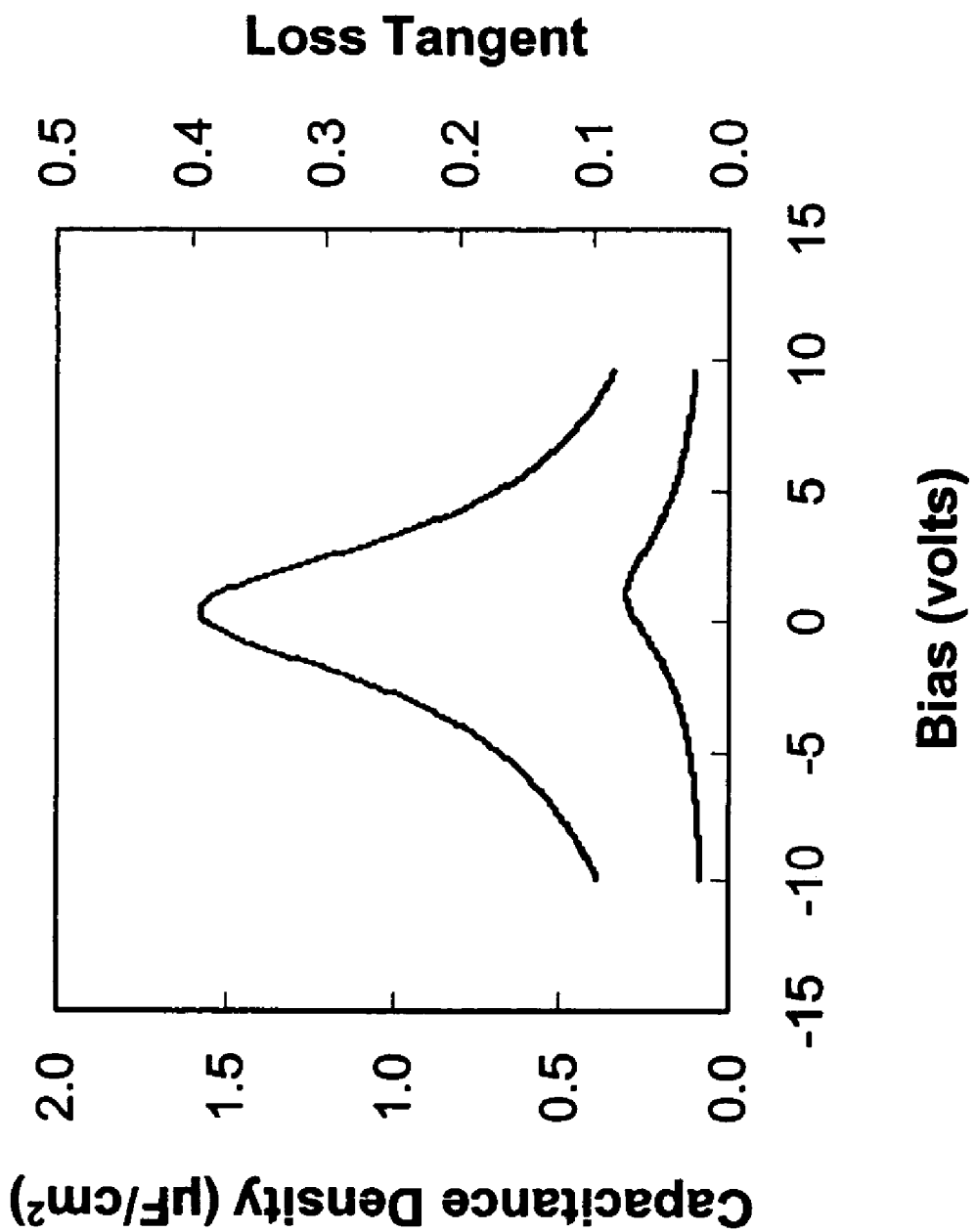
FIG. 4 is a graph showing capacitance density and loss tangent as a function of voltage for undoped barium titanate after re-oxidation.
Figure 5:
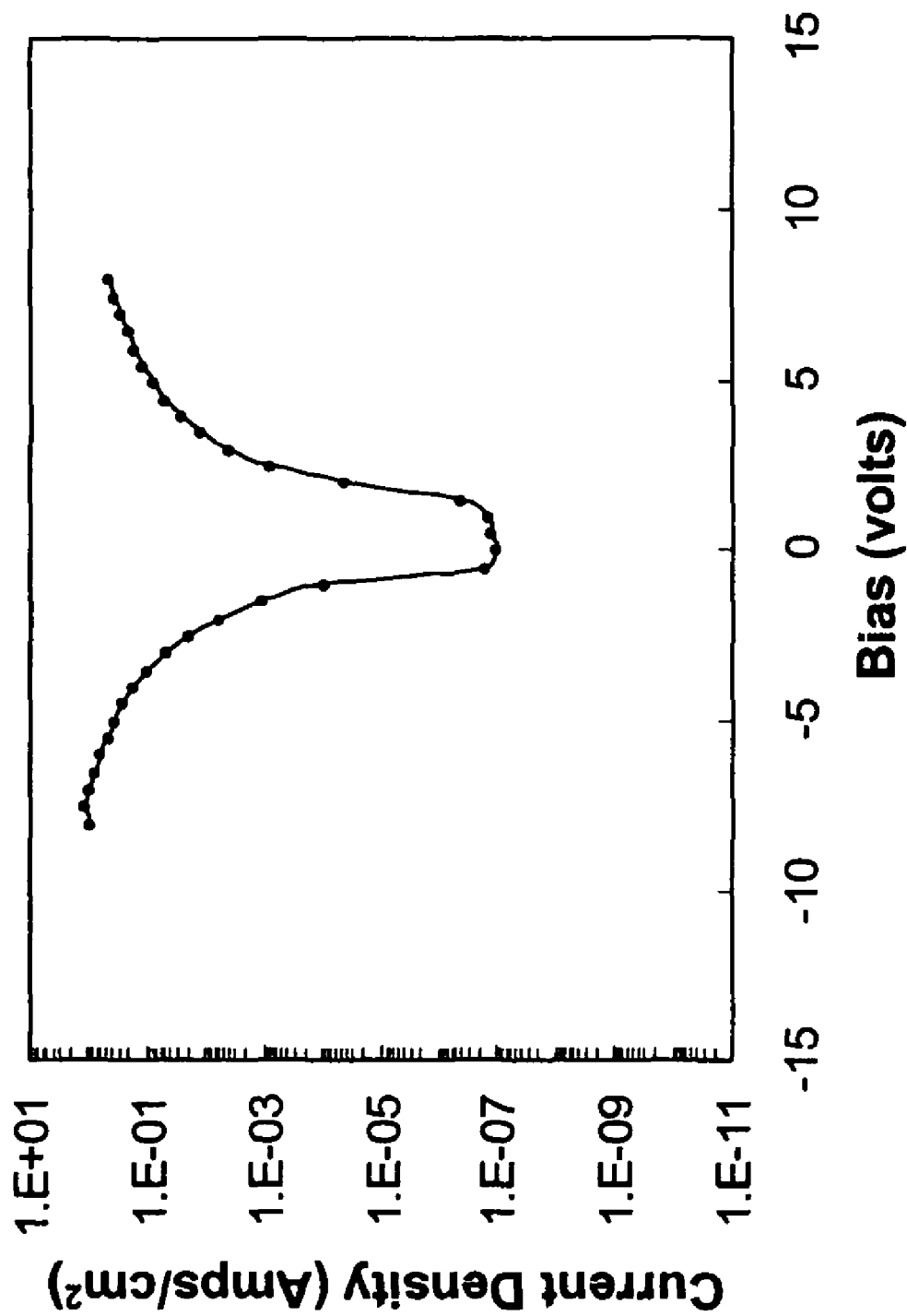
FIG. 5 is a graph showing leakage current density as a function of voltage for undoped pure barium titanate after re-oxidation.

The capacitance density was again approximately 1.5 $\mu F/cm^2$ at 0 volt but in this case, the loss tangent remained low as shown in FIG. 4. The pure re-oxidized barium titanate layer exhibited low leakage currents under zero bias but high leakage current densities of the order of 1 amp/$cm^2$ under 10 volts bias as shown in FIG. 5.

EXAMPLE 3

A gallium doped barium titanate thin film was prepared on a copper foil in the similar manner described in EXAMPLE 1 using the precursor solution described below. The gallium dopant solution comprised the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Gallium dopant solution | 0.18 g |

Figure 6:
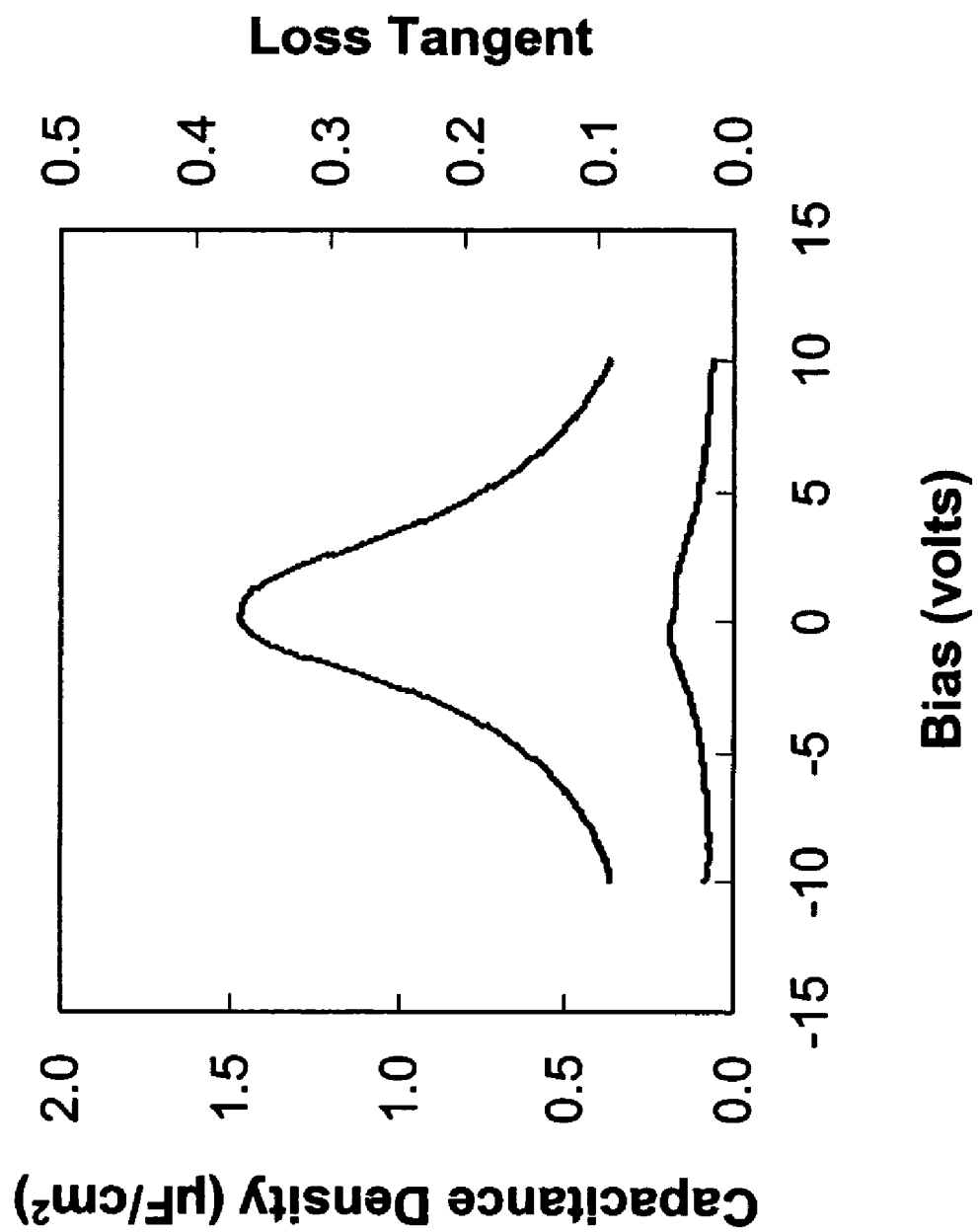
FIG. 6 is a graph showing capacitance density and loss tangent as a function of voltage for gallium doped barium titanate without re-oxidation.
Figure 7:
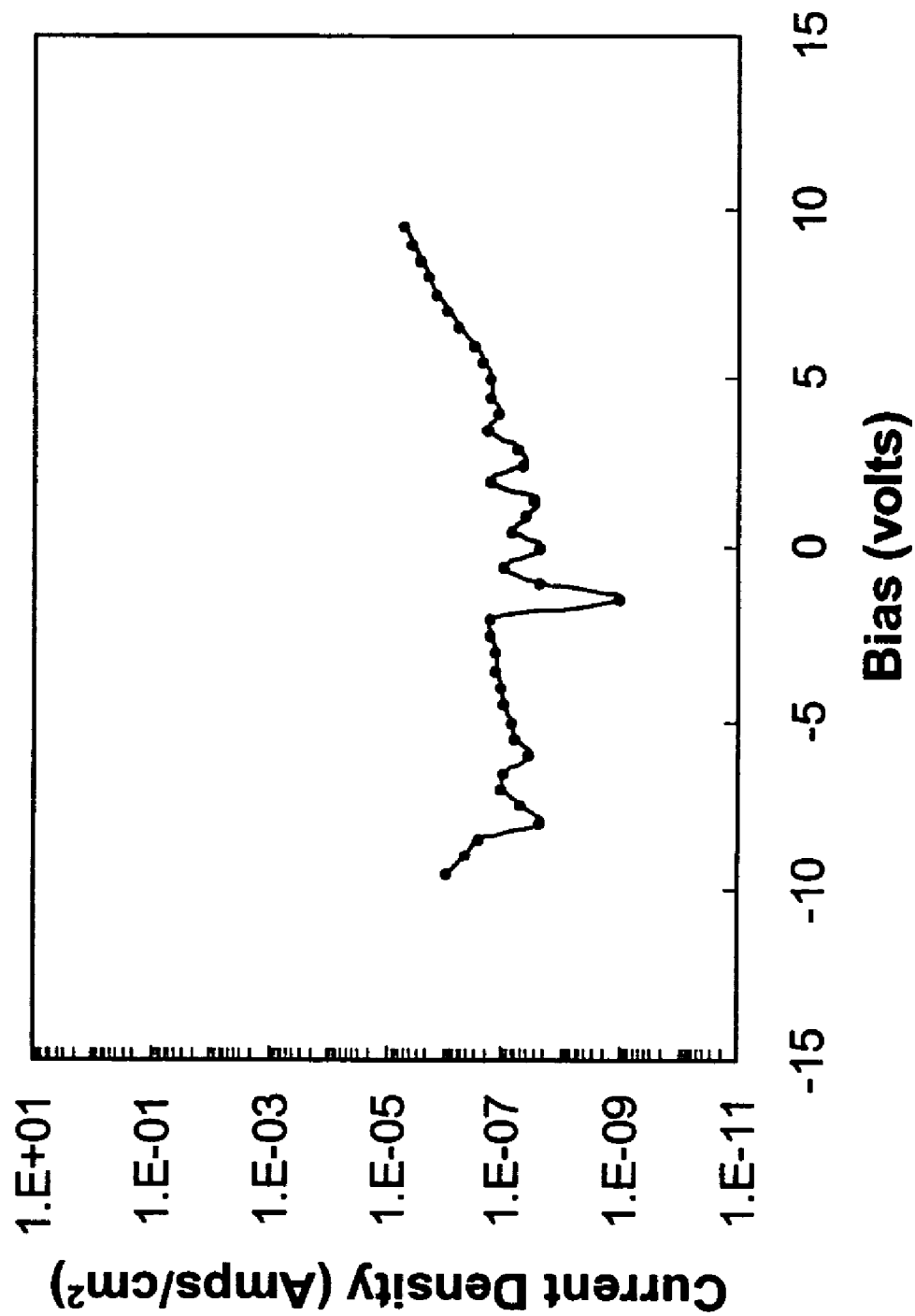
FIG. 7 is a graph showing leakage current density as a function of voltage for gallium doped barium titanate without re-oxidation.

The capacitance density and loss tangent for a gallium doped barium titanate layer without re-oxidation are shown in FIG. 6. The capacitance density was approximately 1.5 $\mu F/cm^2$ at 0 volt and the loss tangent was $\leq 5$ percent and the dissipation factor did not degrade under bias. As shown in FIG. 7, the gallium doped barium titanate without an oxidation procedure showed a low leakage current density of approximately 10 micro-amps/$cm^2$ at 10 volts bias or approximately 100,000 times lower leakage current flow versus the re-oxidized undoped barium titanate.

EXAMPLE 4

A cobalt doped barium titanate thin film was prepared on a copper foil in the similar manner described in EXAMPLE 1 using the precursor solution described below. The cobalt dopant solution comprised the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |

-continued

| | |
|---|---|
| Diethanolamine | 0.21 g |
| Cobalt dopant solution | 0.18 g |

Figure 8:
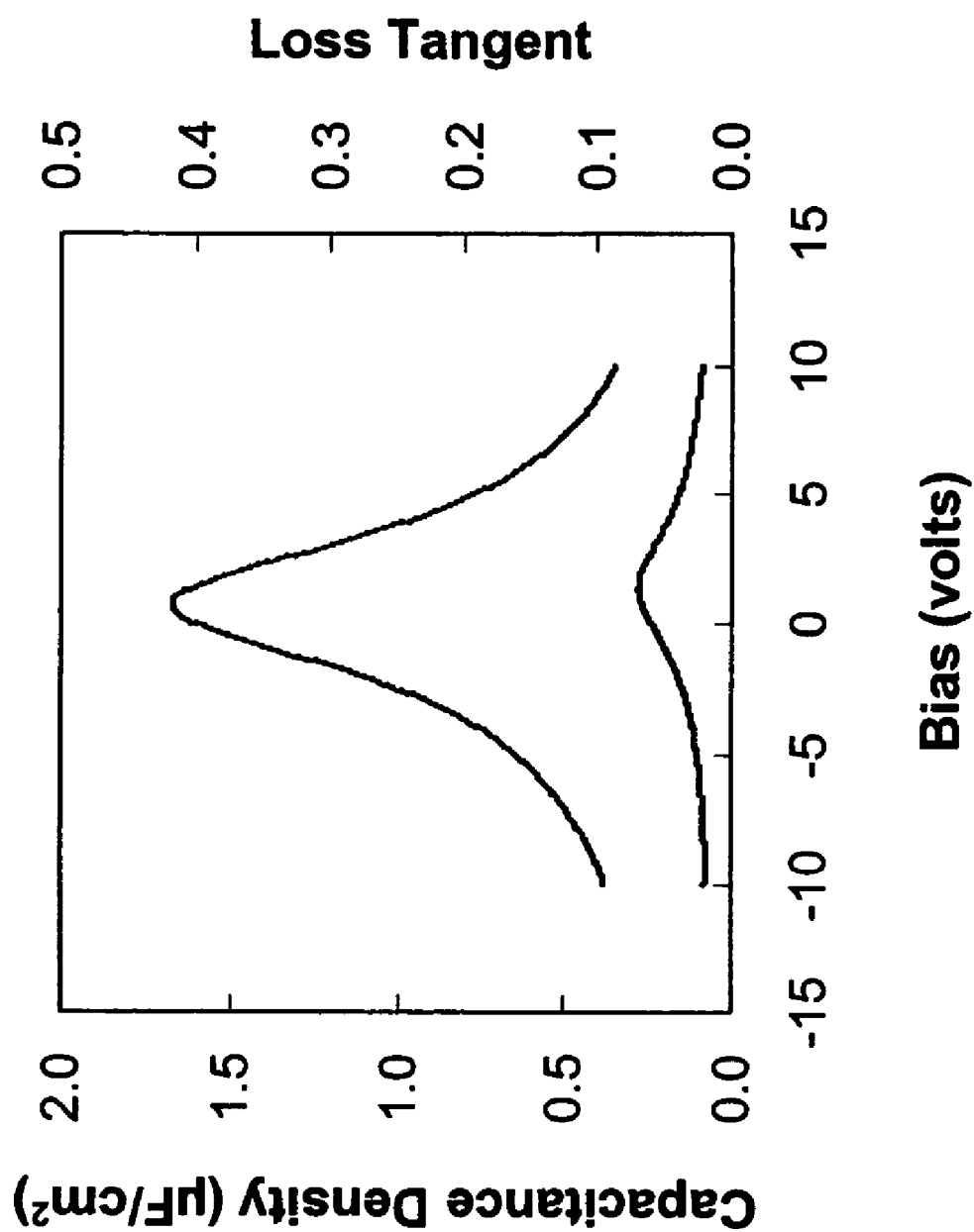
FIG. 8 is a graph showing capacitance density and loss tangent as a function of voltage for cobalt doped barium titanate without re-oxidation.
Figure 9:
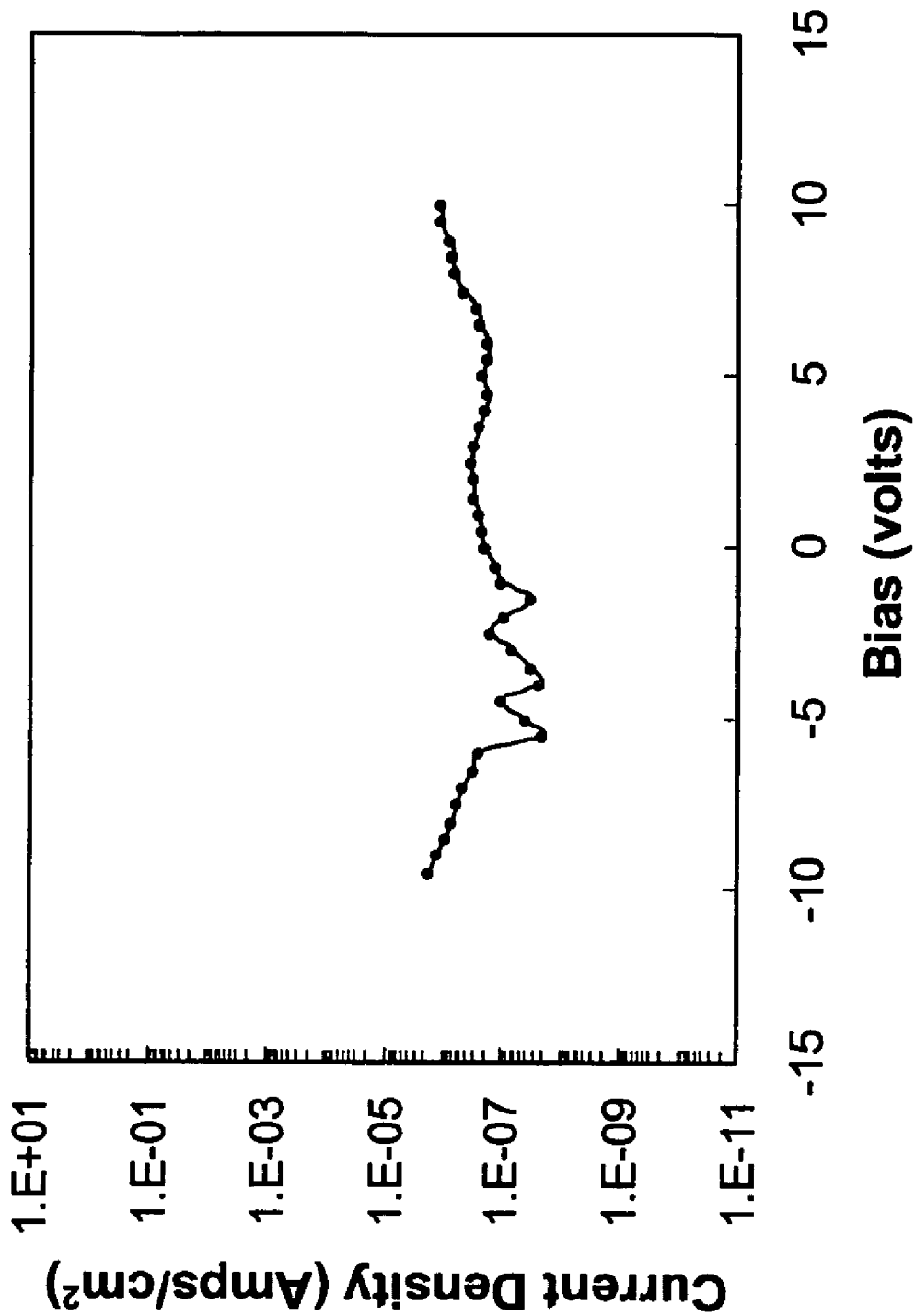
FIG. 9 is a graph showing leakage current density as a function of voltage for cobalt doped barium titanate without re-oxidation.

The capacitance density and loss tangent for a cobalt doped barium titanate layer without re-oxidation are shown in FIG. 8. The capacitance density was approximately 1.7 $\mu F/cm^2$ at 0 volt and the loss tangent was <7 percent and the dissipation factor did not degrade under bias. As shown in FIG. 9, the cobalt doped barium titanate without a re-oxidation procedure showed a low leakage current density of approximately 1 micro-amps/$cm^2$ at 10 volts bias or approximately 1,000,000 times lower leakage current flow versus the re-oxidized undoped barium titanate.

EXAMPLE 5

A nickel doped barium titanate thin film was prepared on a copper foil in the similar manner described in EXAMPLE 1 using the precursor solution described below. The nickel dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Nickel dopant solution | 0.18 g |

Figure 10:
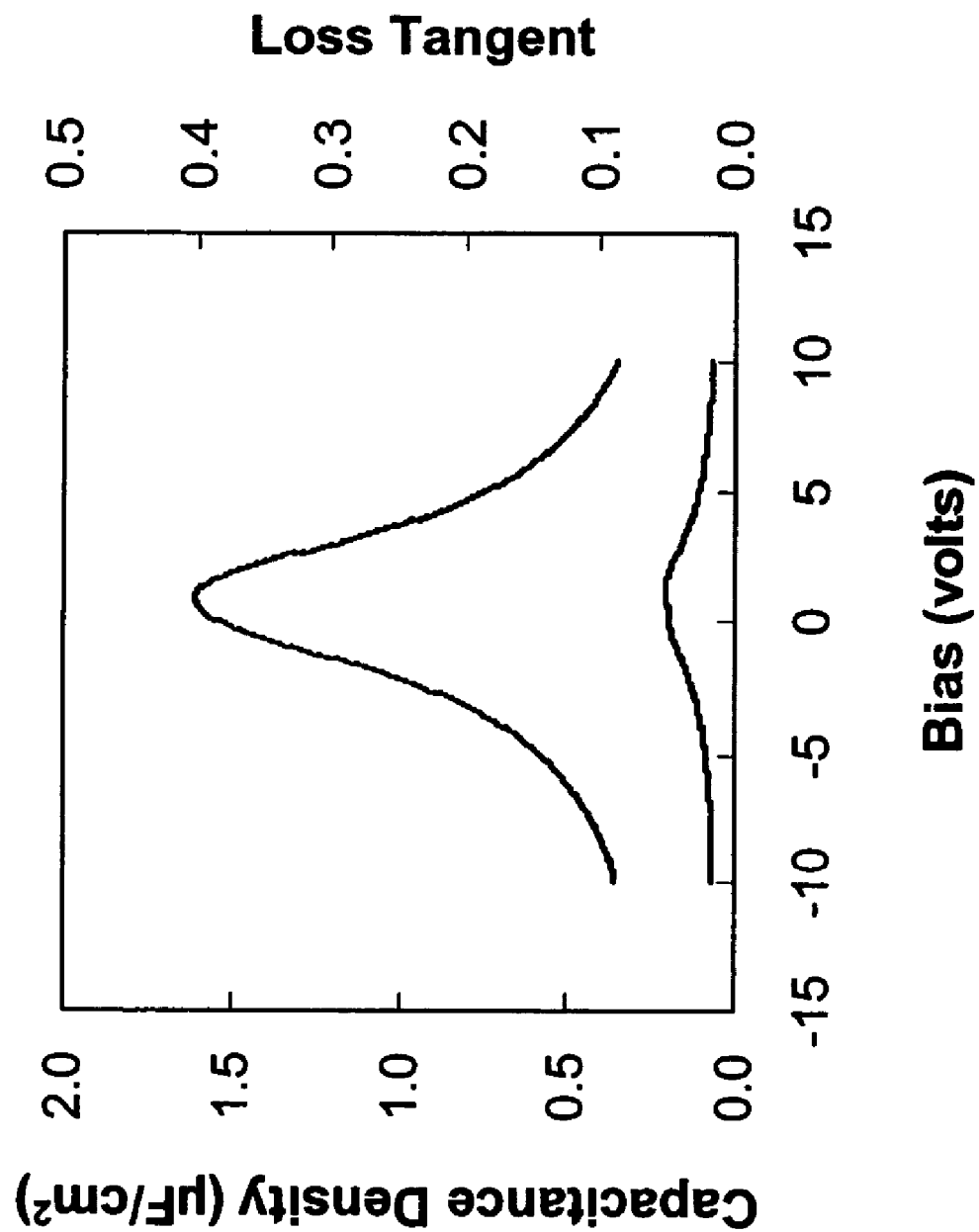
FIG. 10 is a graph showing capacitance density and loss tangent as a function of voltage for nickel doped barium titanate without re-oxidation.
Figure 11:
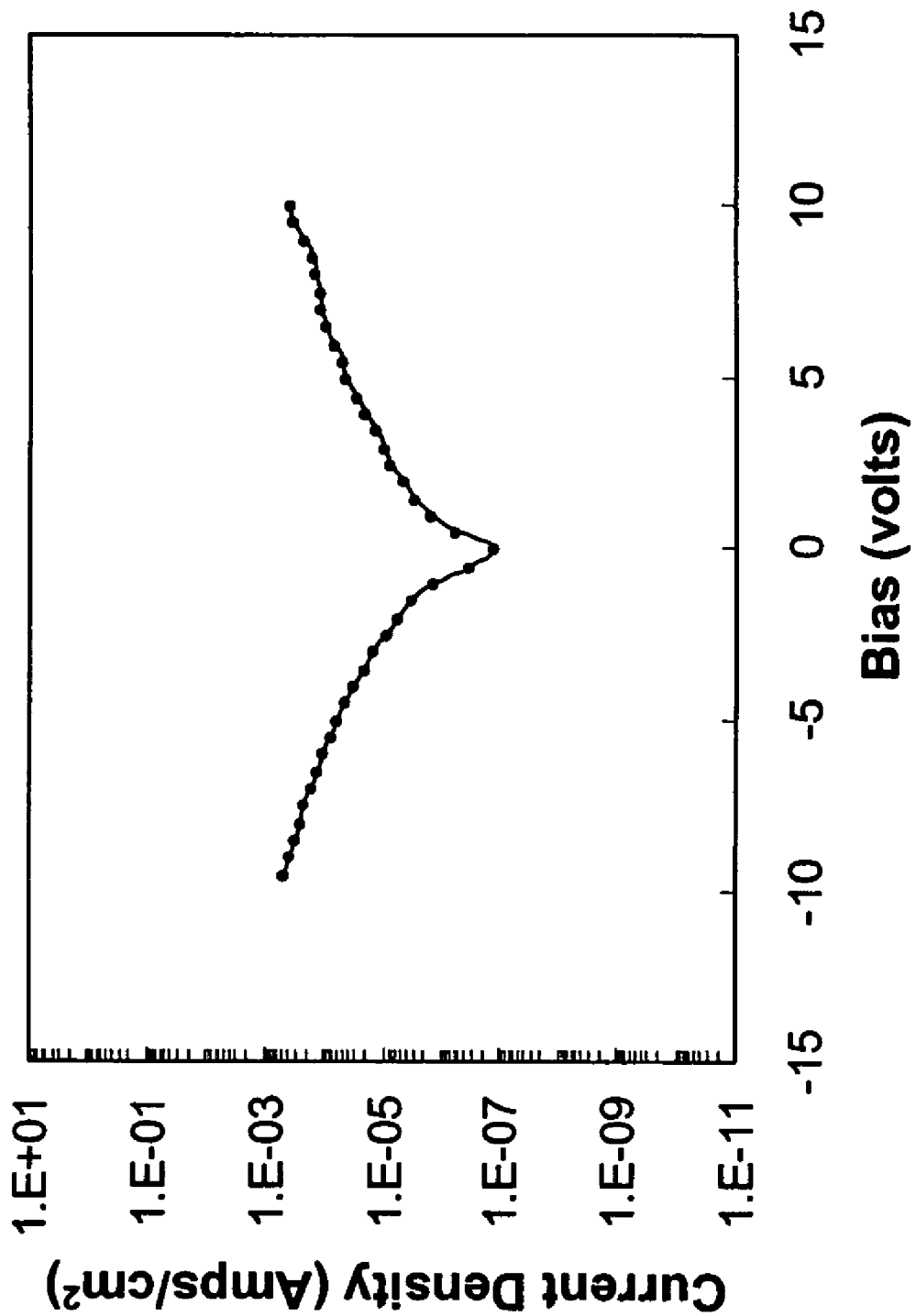
FIG. 11 is a graph showing leakage current density as a function of voltage for nickel doped barium titanate without re-oxidation.

The capacitance density and loss tangent for a nickel doped barium titanate layer without re-oxidation are shown in FIG. 10. The capacitance density was approximately 1.7 $\mu F/cm^2$ at 0 volt and the loss tangent was $\leq 5$ percent and the dissipation factor did not degrade under bias. As shown in FIG. 11, the nickel doped barium titanate without a re-oxidation procedure showed a low leakage current density of approximately 1000 micro-amps/$cm^2$ at 10 volts bias or approximately 1,000 times lower leakage current flow versus the re-oxidized undoped barium titanate.

EXAMPLE 6

A magnesium doped barium titanate thin film was prepared on a copper foil in the similar manner described in EXAMPLE 1 using the precursor solution described below. The magnesium dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Magnesium dopant solution | 0.17 g |

Figure 12:
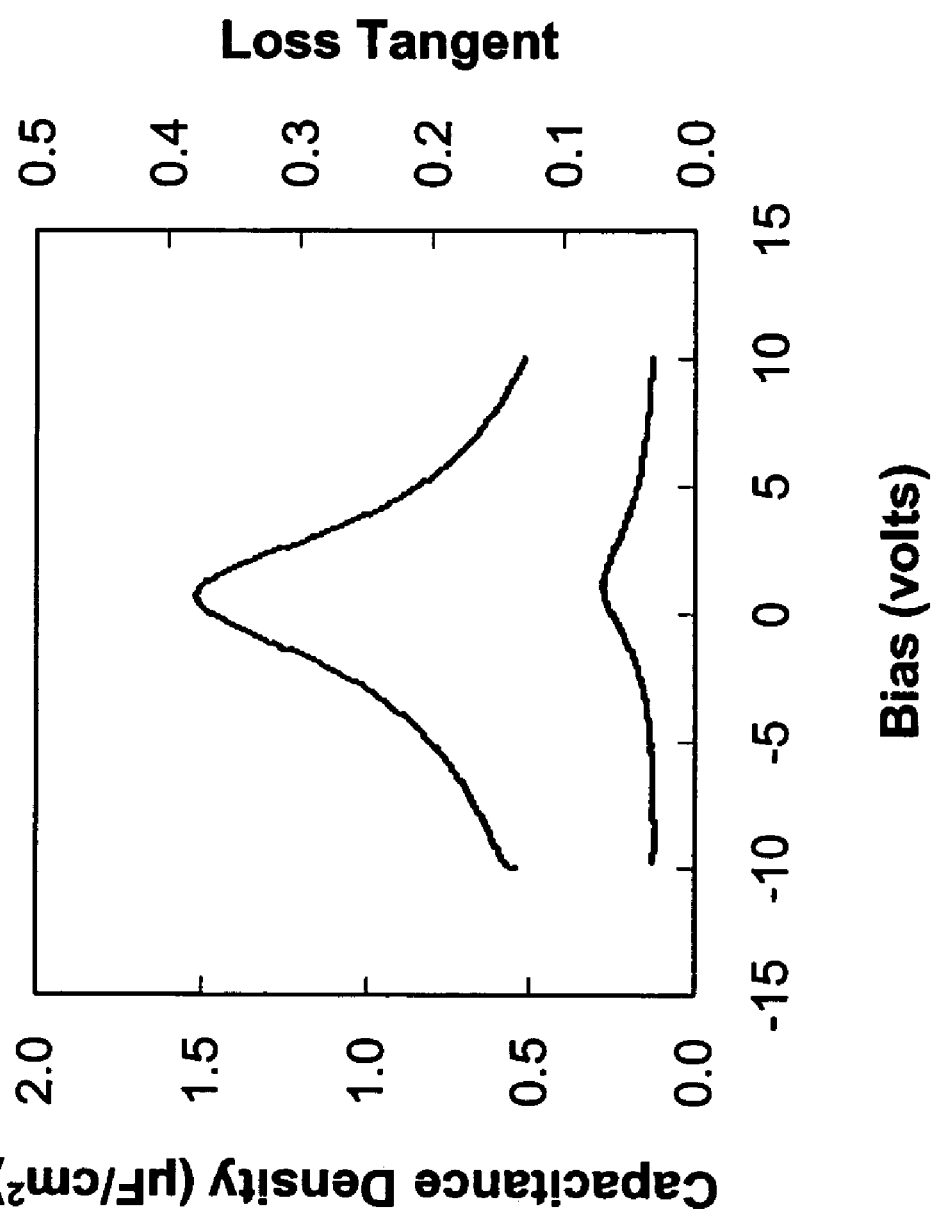
FIG. 12 is a graph showing capacitance density and loss tangent as a function of voltage for magnesium doped barium titanate without re-oxidation.
Figure 13:
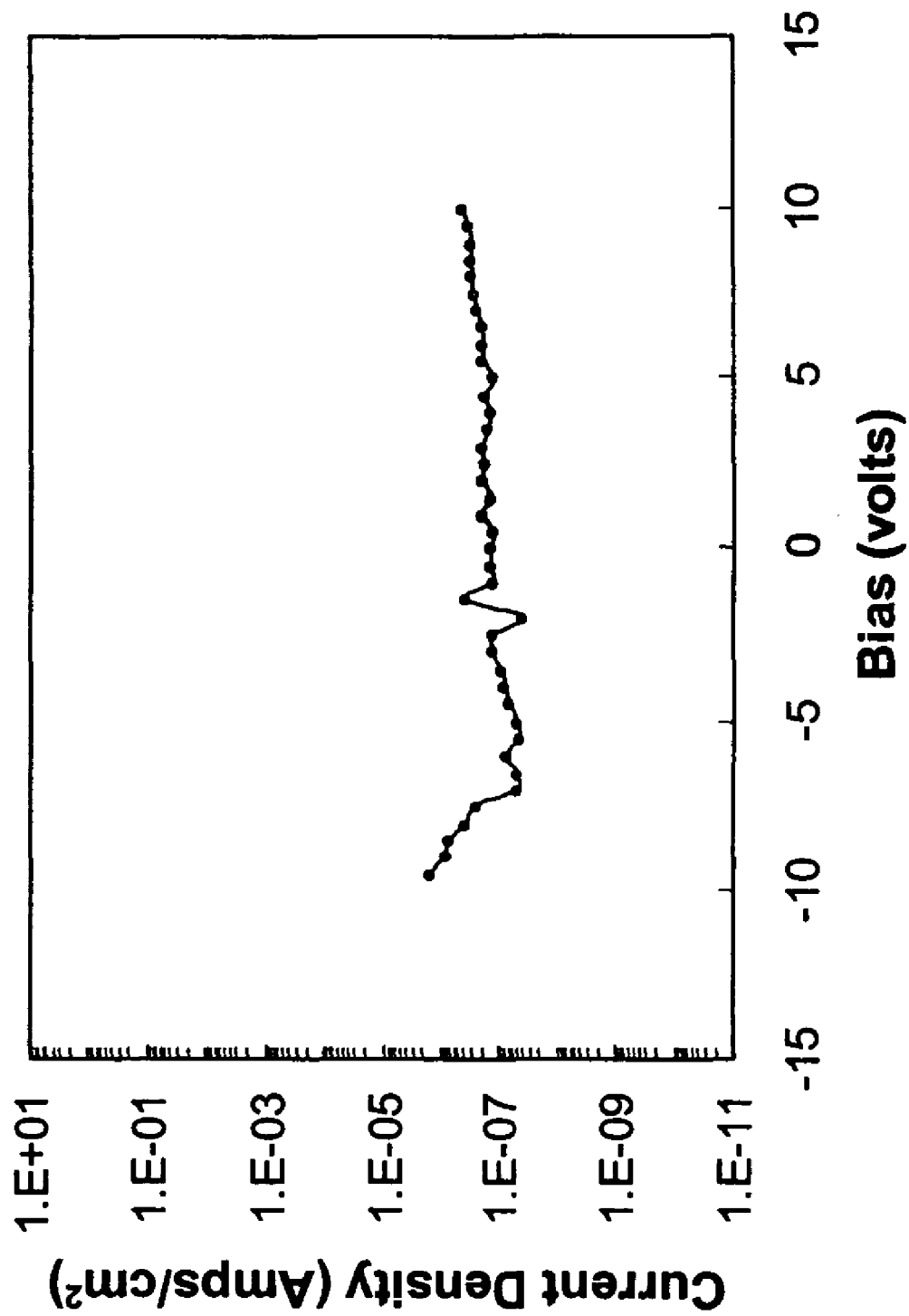
FIG. 13 is a graph showing leakage current density as a function of voltage for magnesium doped barium titanate without re-oxidation.

The capacitance density and loss tangent for a magnesium doped barium titanate layer without re-oxidation are shown in FIG. 12. The capacitance density was approximately 1.6 $\mu F/cm^2$ at 0 volt and the loss tangent was <7 percent and the dissipation factor did not degrade under bias. As shown in FIG. 13, the magnesium doped barium titanate without a re-oxidation procedure showed a low leakage current density of approximately 1 micro-amps/$cm^2$ at 10 volts bias or approximately 1,000,000 times lower leakage current flow versus the re-oxidized undoped barium titanate.

EXAMPLE 7

An iron doped barium titanate thin film was prepared on a copper foil in the similar manner described in EXAMPLE 1 using the precursor solution described below. The iron dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Iron dopant solution | 0.17 g |

Figure 14:
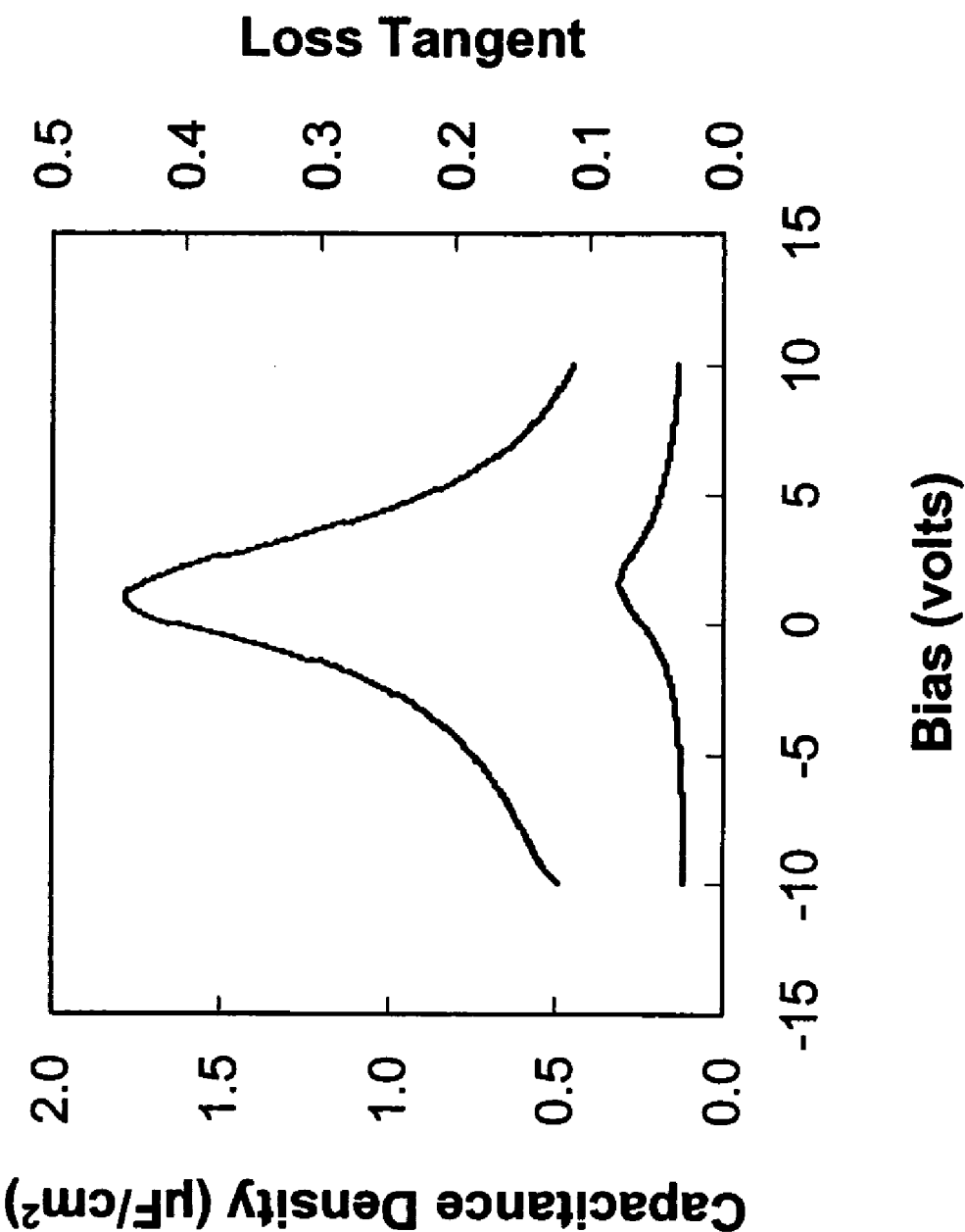
FIG. 14 is a graph showing capacitance density and loss tangent as a function of voltage for iron doped barium titanate without re-oxidation.
Figure 15:
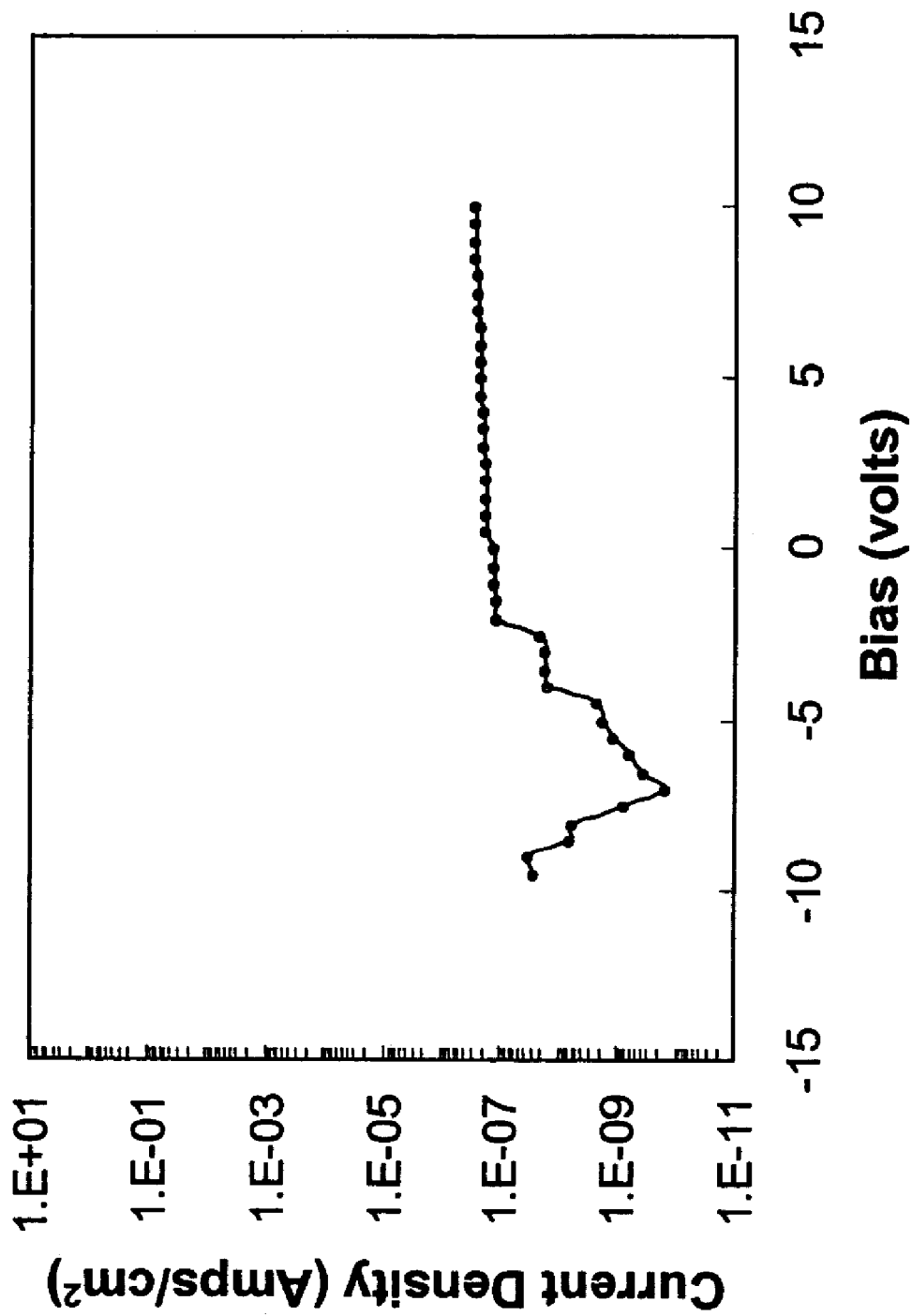
FIG. 15 is a graph showing leakage current density as a function of voltage for iron doped barium titanate without re-oxidation.

The capacitance density and loss tangent for an iron doped barium titanate layer without re-oxidation are shown in FIG. 14. The capacitance density was approximately 1.8 μF/cm² at 0 volt and the loss tangent was <6 percent and the dissipation factor did not degrade under bias. As shown in FIG. 15, the iron doped barium titanate without a re-oxidation procedure showed a low leakage current density of approximately 1 micro-amps/cm² at 10 volts bias or approximately 1,000,000 times lower leakage current flow versus the re-oxidized undoped barium titanate.

EXAMPLE 8

An yttrium doped barium titanate thin film was prepared on a copper foil in the similar manner described in EXAMPLE 1 using the precursor solution described below. The yttrium dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Yttrium dopant solution | 0.19 g |

Figure 16:
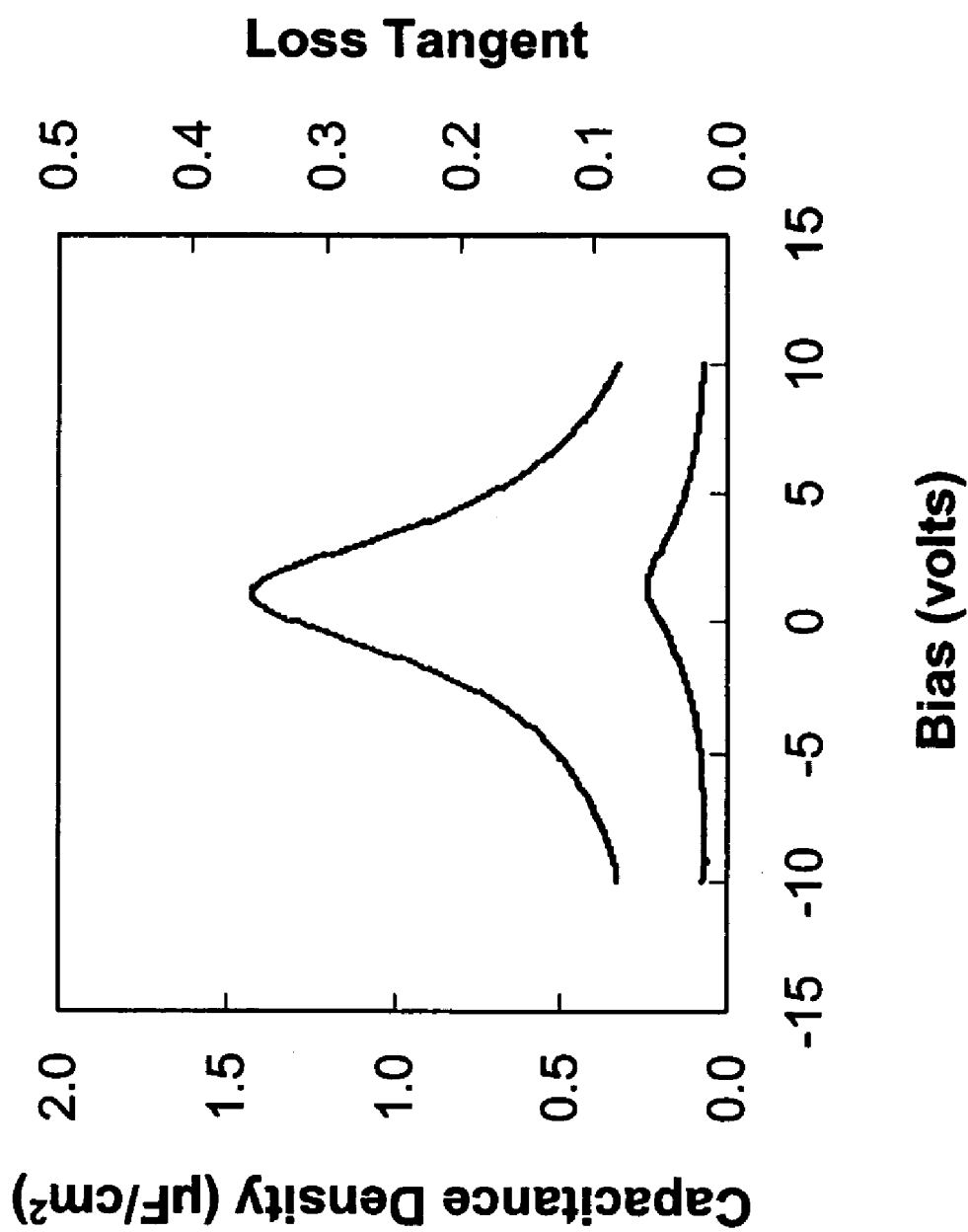
FIG. 16 is a graph showing capacitance density and loss tangent as a function of voltage for yttrium doped barium titanate without re-oxidation.
Figure 17:
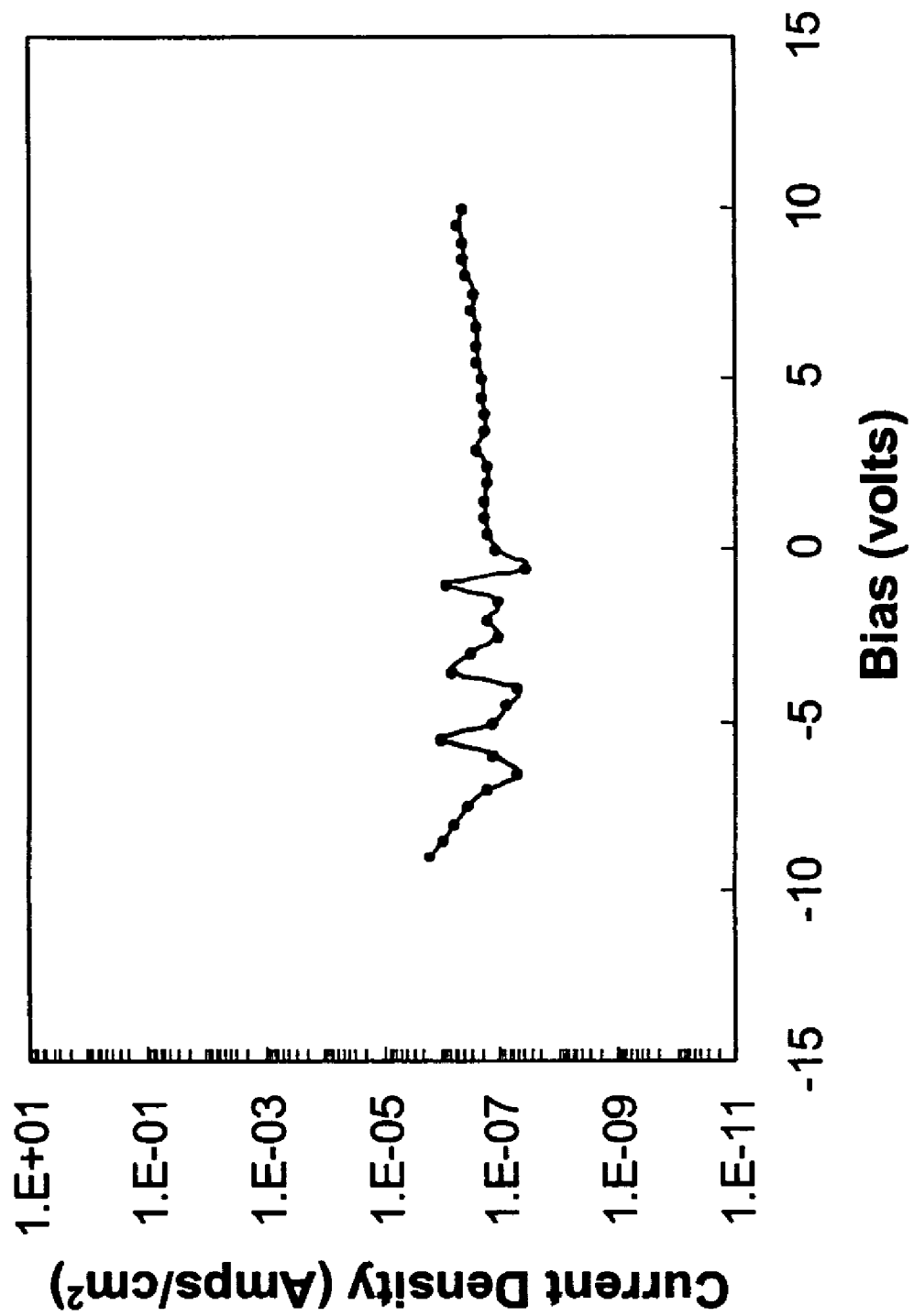
FIG. 17 is a graph showing leakage current density as a function of voltage for yttrium doped barium titanate without re-oxidation.

The capacitance density and loss tangent for an yttrium doped barium titanate layer without re-oxidation are shown in FIG. 16. The capacitance density was approximately 1.5 μF/cm² at 0 volt and the loss tangent was ≦6 percent and the dissipation factor did not degrade under bias. As shown in FIG. 17, the yttrium doped barium titanate without a re-oxidation showed a low leakage current density of approximately 1 micro-amps/cm² at 10 volts bias or approximately 1,000,000 times lower leakage current flow versus the re-oxidized undoped barium titanate.

EXAMPLE 9

An aluminum doped barium titanate thin film was prepared on a copper foil in the similar manner described in EXAMPLE 1 using the precursor solution described below. The aluminum dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Aluminum dopant solution | 0.18 g |

Figure 18:
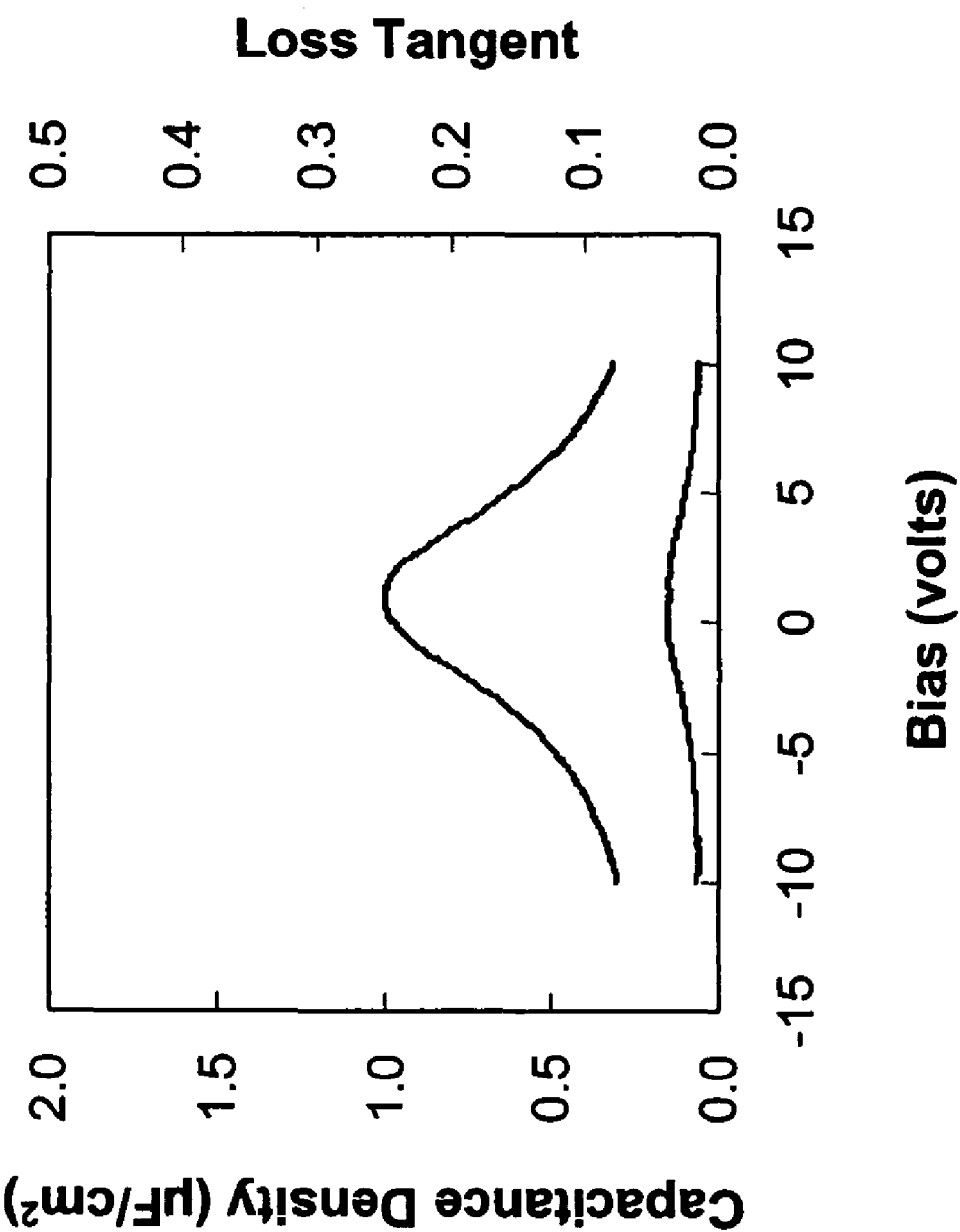
FIG. 18 is a graph showing capacitance density and loss tangent as a function of voltage for aluminum doped barium titanate without re-oxidation.

The capacitance density and loss tangent for a aluminum doped barium titanate layer without re-oxidation are shown in FIG. 18. The capacitance density was approximately 1.1 μF/cm² at 0 volt and the loss tangent was <5 percent and the dissipation factor did not degrade under bias.

EXAMPLE 10

A zinc doped barium titanate thin film was prepared on a copper foil in the similar manner described in EXAMPLE 1 using the precursor solution described below. The zinc dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Zinc dopant solution | 0.18 g |

Figure 19:
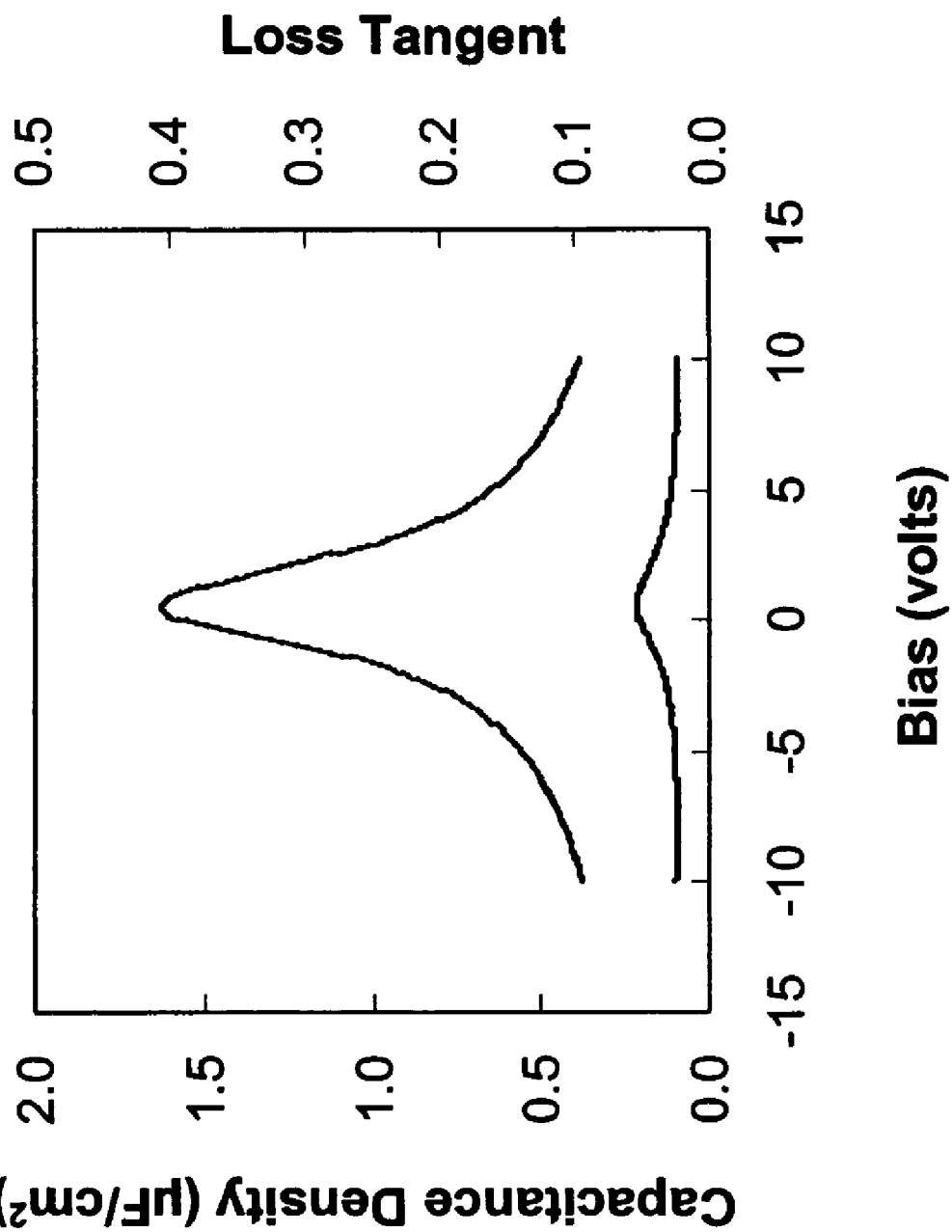
FIG. 19 is a graph showing capacitance density and loss tangent as a function of voltage for zinc doped barium titanate without re-oxidation.

The capacitance density and loss tangent for a zinc doped barium titanate layer without re-oxidation are shown in FIG. 19. The capacitance density was approximately 1.7 μF/cm² at 0 volt and the loss tangent was ≦5 percent and the dissipation factor did not degrade under bias.

EXAMPLE 11

A calcium doped barium titanate thin film was prepared on a copper foil in the similar manner described in EXAMPLE 1 using the precursor solution described below. The calcium dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Calcium dopant solution | 0.17 g |

Figure 20:
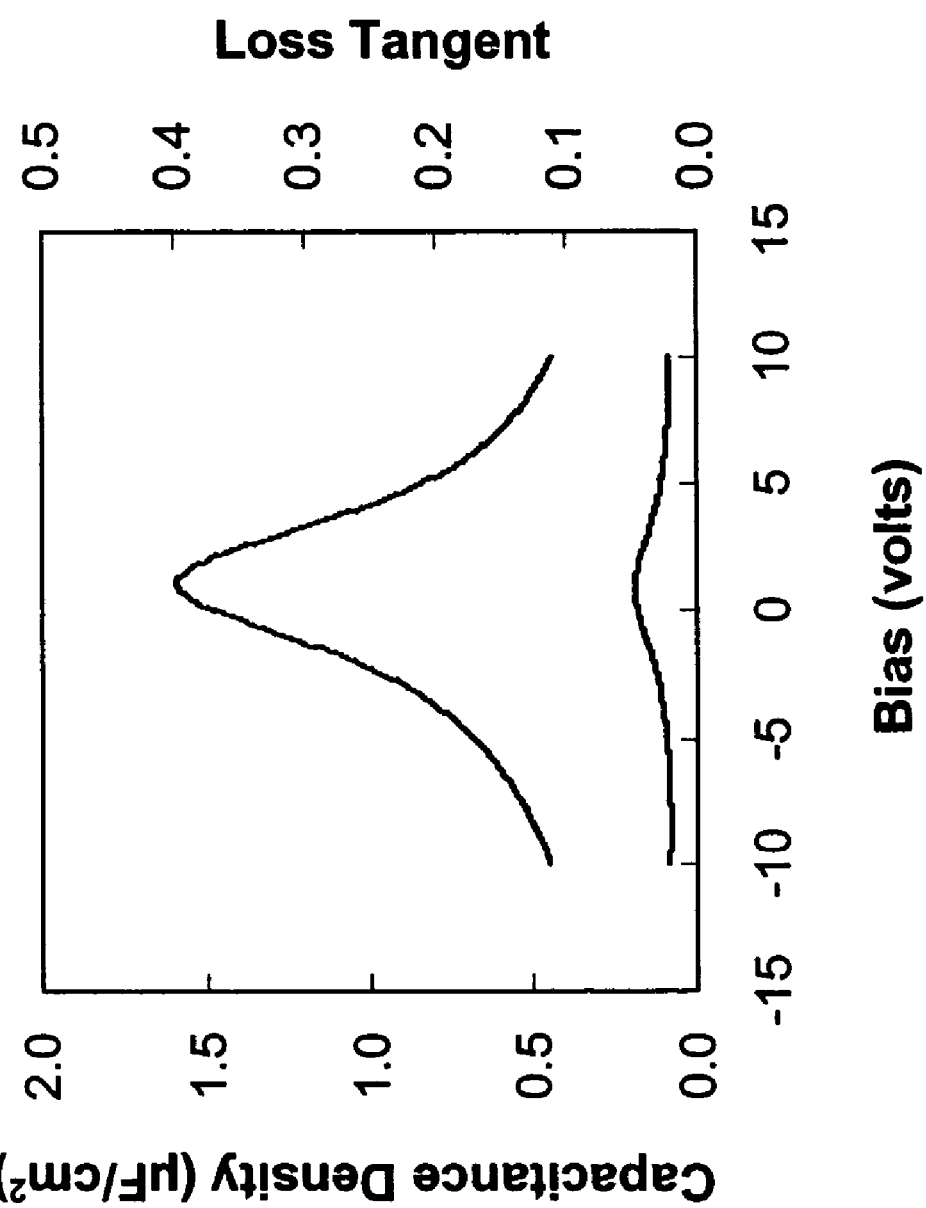
FIG. 20 is a graph showing capacitance density and loss tangent as a function of voltage for calcium doped barium titanate without re-oxidation.

The capacitance density and loss tangent for a calcium doped barium titanate layer without re-oxidation are shown in FIG. 20. The capacitance density was approximately 1.7 μF/cm² at 0 volt and the loss tangent was ≦5 percent and the dissipation factor did not degrade under bias.

EXAMPLE 12

An ytterbium doped barium titanate thin film was prepared on a copper foil in the similar manner described in EXAMPLE 1 using the precursor solution described below. The ytterbium dopant solution comprises the chemicals listed in Table I:

| | |
|---|---|
| Barium acetate | 2.0 g |
| Titanium isopropoxide | 2.22 g |
| Acetylacetone | 1.56 g |
| Acetic acid | 17.0 g |
| Diethanolamine | 0.21 g |
| Ytterbium dopant solution | 0.17 g |

Figure 21:
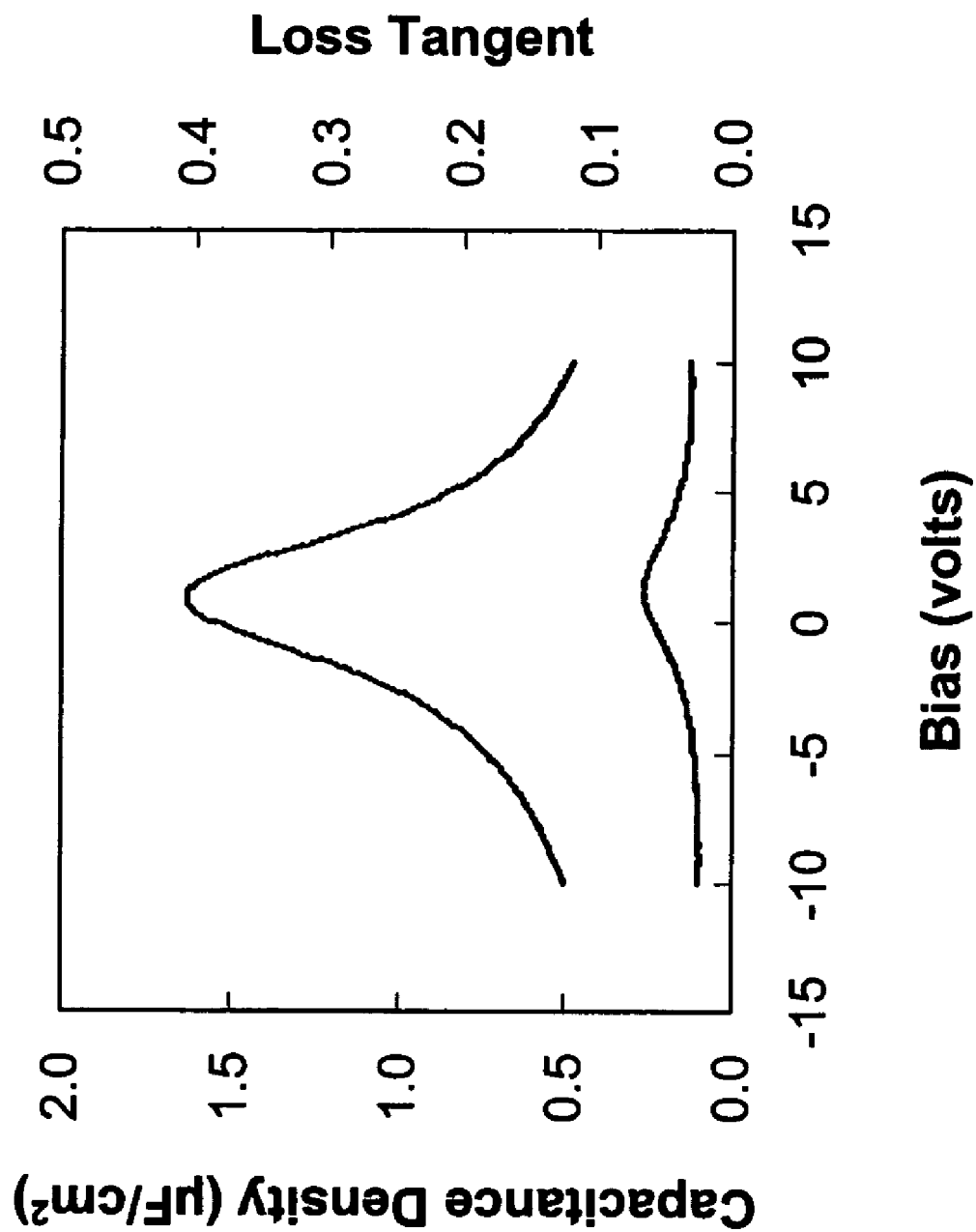
FIG. 21 is a graph showing capacitance density and loss tangent as a function of voltage for ytterbium doped barium titanate without re-oxidation.

The capacitance density and loss tangent for an ytterbium doped barium titanate layer without re-oxidation are shown in FIG. 21. The capacitance density was approximately 1.7 $\mu F/cm^2$ at 0 volt and the loss tangent was $\leq 6\%$ and the dissipation factor did not degrade under bias.

EXAMPLE 13

A cobalt doped barium strontium titanate (Ba:Sr:Ti=0.6:0.4:1) thin film was prepared on a copper foil in the similar manner described in EXAMPLE 1 except that barium acetate was partially replaced by strontium acetate to give a molar ratio of 60/40. Additionally, the cobalt dopant level was ca. 0.01 atom percent versus ca. 0.02 atom percent dopant level for examples 1 through 12. The precursor solution is shown below. The cobalt dopant solution comprises the chemicals listed in Table I:

| | |
|---|---|
| Barium acetate | 3.0 g |
| Strontium acetate hydrate | 1.61 g |
| Titanium isopropoxide | 5.56 g |
| Acetylacetone | 3.92 g |
| Acetic acid | 40.85 g |
| Diethanolamine | 0.32 g |
| Cobalt dopant solution | 0.27 g |

Figure 22:
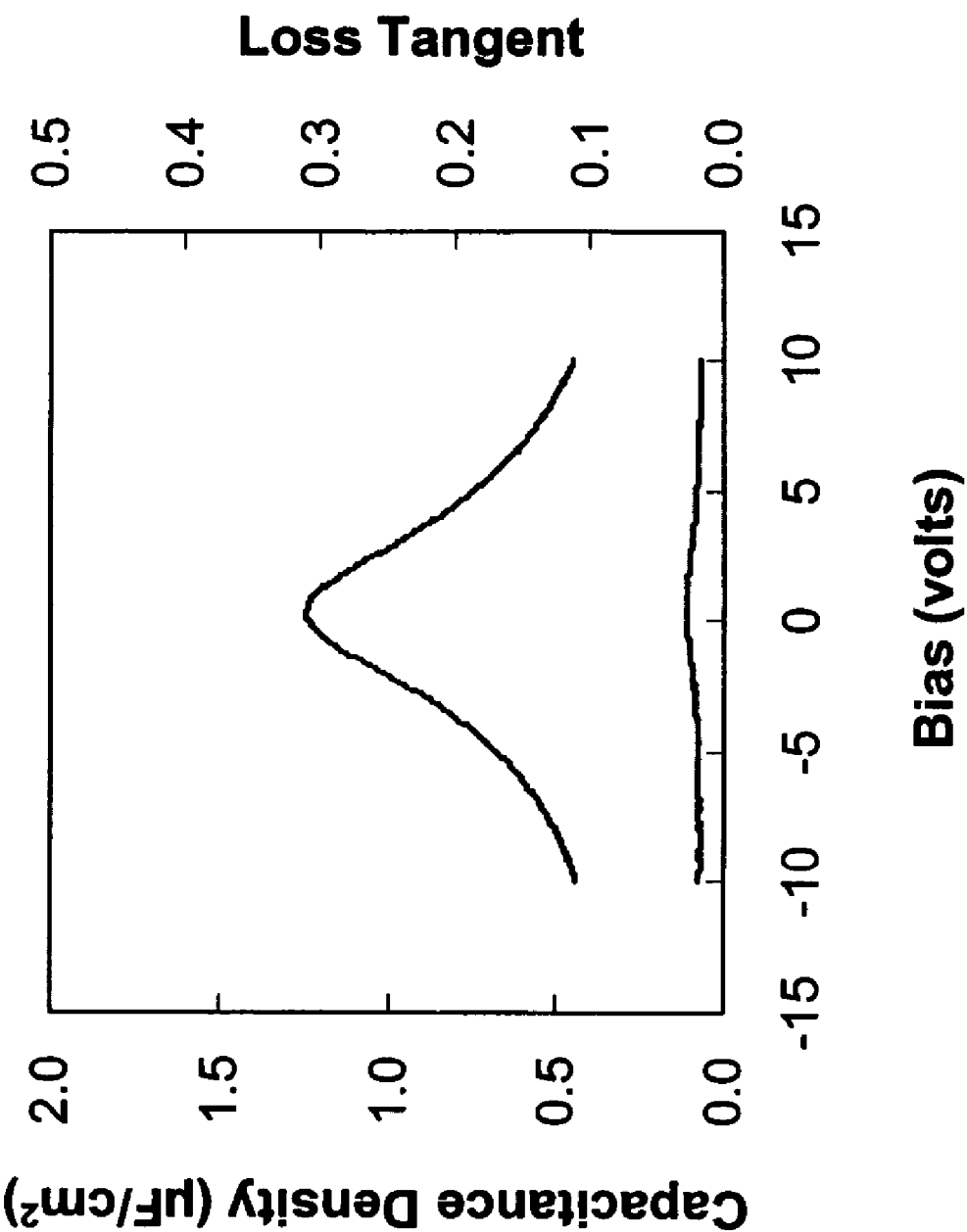
FIG. 22 is a graph showing capacitance density and loss tangent as a function of voltage for cobalt doped barium strontium titanate (Ba:Sr:Ti=0.6:0.4:1) without oxidation.
Figure 23:
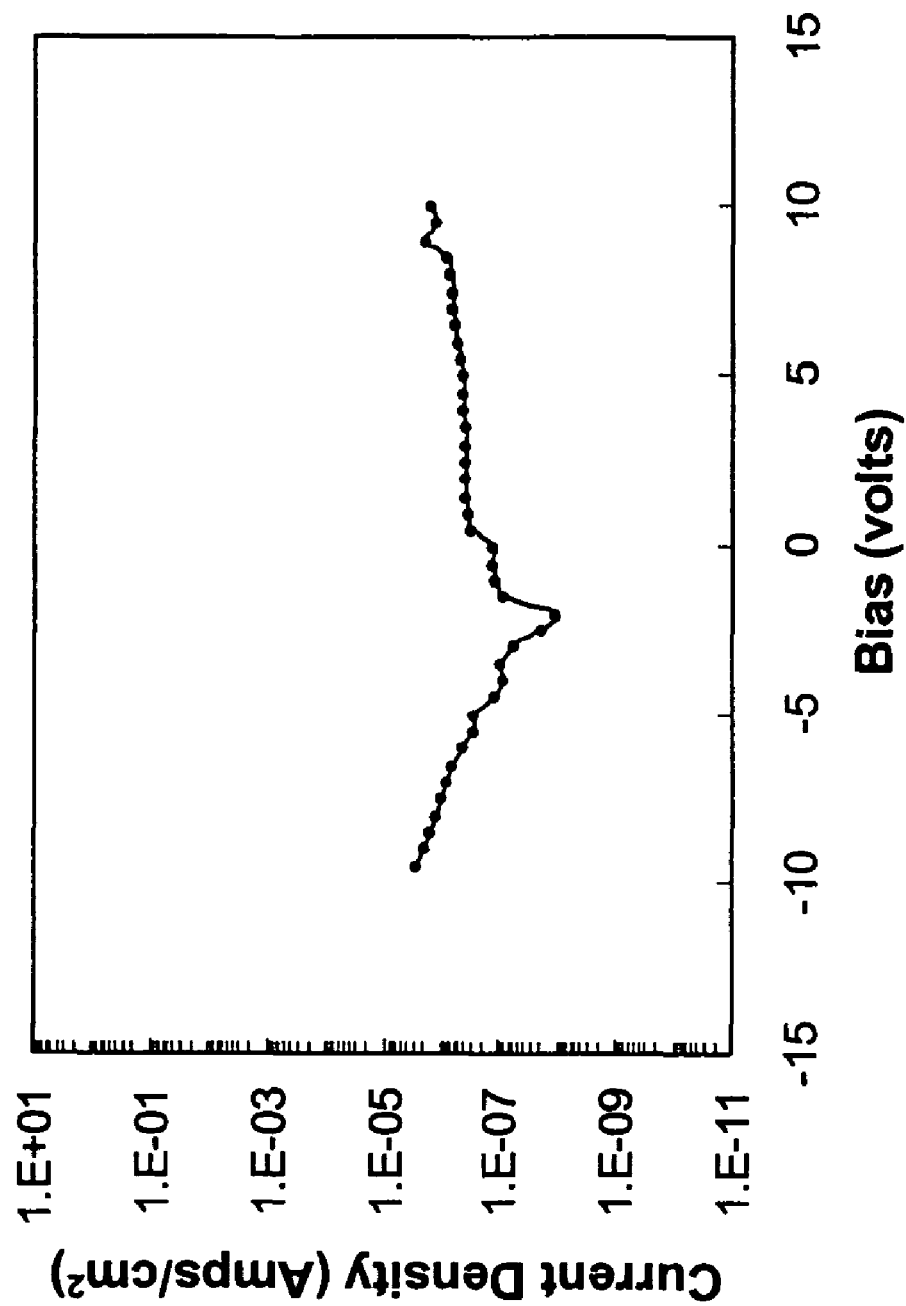
FIG. 23 is a graph showing leakage current density as a function of voltage for cobalt doped barium strontium titanate (Ba:Sr:Ti=0.6:0.4:1) without re-oxidation.

The capacitance density and loss tangent for a cobalt doped barium strontium titanate layer without re-oxidation are shown in FIG. 22. The capacitance density was approximately 1.3 $\mu F/cm^2$ at 0 volt and the loss tangent was $\leq 0.5$ percent and the dissipation factor did not degrade under bias. As shown in FIG. 23, the cobalt doped barium strontium titanate without a re-oxidation procedure showed a low leakage current density of approximately 1 micro-amps/$cm^2$ at 10 volts bias or approximately 1,000,000 times lower leakage current flow versus the re-oxidized undoped barium titanate.

What is claimed is:

1. A method of making an innerlayer panel comprising:
    forming a capacitor by the step of
        providing a base metallic foil;
        forming a dielectric layer over a first side of the metallic foil, wherein the dielectric layer is formed from a chemical precursor solution comprising:
            one or more barium/titanium-containing additives selected from the group consisting of (a) barium titanate, (b) any composition that can form barium titanate during firing, and (c) mixtures thereof; dissolved in an organic medium; and
            0.002 to 0.05 atom percent of a dopant comprising an element selected from the group consisting of Sc, Cr, Fe, Co, Ni, Mg, Ca, Zn, Al, Ga, Y, Nd, Sm, Eu, Gd, Dy, Ho, Er, Yb, Lu and mixtures thereof;
        annealing the dielectric layer at a temperature in the range of about 800° C. to 1050° C. in a reducing atmosphere having an oxygen partial pressure of less than about $10^{-8}$ atmospheres to produce a dielectric thin film with a thickness less than 1 micron on the metallic foil; and
        forming a conductive layer over the dielectric thin film, whereby the metallic foil, the dielectric thin film, and the conductive layer form the capacitor; and
        wherein the dielectric thin film is not re-oxygenated after the annealing; and
    incorporating the capacitor into an innerlayer panel by bonding a second side of the metallic foil to an organic laminate structure.

2. The method of claim 1, wherein annealing results in a dielectric thin film comprising crystalline barium titanate or crystalline barium strontium titanate.

3. The method of claim 1, wherein the capacitor has a capacitance density of at least 0.5 $\mu F/cm^2$.

4. An innerlayer panel comprising
    a capacitor comprising
        a dielectric thin film with a thickness less than 1 micron that is annealed in a reducing atmosphere having an oxygen partial pressure of less than about $10^{-8}$ atmospheres on a first side of a base metallic foil;
        wherein the dielectric thin film comprises:
            barium titanate or barium strontium titanate; and
            0.002 to 0.05 atom percent of a dopant comprising an element selected from the group consisting of Sc, Cr, Fe, Co, Ni, Mg, Ca, Zn, Al, Ga, Y, Nd, Sm, Eu, Gd, Dy, Ho, Er, Yb, Lu and mixtures thereof;
        and wherein the dielectric thin film is not re-oxygenated after annealing in the reducing atmosphere; and
    an organic laminate structure wherein a second side of the metallic foil of said capacitor is bonded to the organic laminate structure.

5. The innerlayer panel of claim 4 wherein the barium in said dielectric thin film has been partially or substantially replaced by one or more metal cations having the oxide stoichiometry of MO wherein M is selected from the group consisting of (a) strontium; (b) lead; (c) calcium; and (d) mixtures thereof.

6. The innerlayer panel of claim 4 wherein the titanium in said dielectric thin film has been partially or substantially replaced by one or more metal cations having the oxide stoichiometry of $MO_2$ wherein M is selected from the group consisting of (a) zirconium; (b) hafnium; (c) tin; and (d) mixtures thereof.

7. A printed wiring board comprising the innerlayer panel of claim 4.

* * * * *